United States Patent
Ali et al.

(10) Patent No.: US 10,763,878 B2
(45) Date of Patent: Sep. 1, 2020

(54) CALIBRATING TIME-INTERLEAVED SWITCHED-CAPACITOR TRACK-AND-HOLD CIRCUITS AND AMPLIFIERS

(71) Applicant: Analog Devices, Inc., Norwood, MA (US)

(72) Inventors: Ahmed Mohamed Abdelatty Ali, Oak Ridge, NC (US); Paridhi Gulati, Sunnyvale, CA (US); Bryan S. Puckett, Stokesdale, NC (US); Huseyin Dinc, Greensboro, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/364,134

(22) Filed: Mar. 25, 2019

(65) Prior Publication Data
US 2019/0305791 A1    Oct. 3, 2019

Related U.S. Application Data

(60) Provisional application No. 62/648,863, filed on Mar. 27, 2018.

(51) Int. Cl.
*H03M 1/10*   (2006.01)
*H03M 1/06*   (2006.01)

(52) U.S. Cl.
CPC ....... *H03M 1/1033* (2013.01); *H03M 1/0639* (2013.01)

(58) Field of Classification Search
CPC ............. H03M 1/1033; H03M 1/0639; H03M 1/1245; H03M 1/1215
(Continued)

(56) References Cited

U.S. PATENT DOCUMENTS 6,392,575 B1   5/2002   Eklund
6,542,017 B2   4/2003   Manganaro
(Continued)

OTHER PUBLICATIONS

Son et al., *Histogram-Based Calibration Method for Pipeline ADCs*, PLOS | One, DOI:10.1371/journal.pone.0129736, Jun. 12, 2015, 13 pages.
(Continued)

*Primary Examiner* — Khai M Nguyen
(74) *Attorney, Agent, or Firm* — Patent Capital Group

(57) ABSTRACT

Background calibration techniques can effectively to correct for memory, kick-back, and order-dependent errors in interleaved switched-capacitor track-and-hold (T/H) circuits and amplifiers. The techniques calibrate for errors in both the track/sample phase and the hold-phase, and account for the effects of interleaving, buffer/amplifier sharing, incomplete resetting, incomplete settling, chopping, and randomization on the offset, gain, memory, and kick-back errors. Moreover, the techniques can account for order-dependent and state-dependent hold-phase non-linearities. By correcting for these errors, the proposed techniques improve the noise performance, linearity, gain/offset matching, frequency response (and bandwidth), and order-dependence errors. The techniques also help increase the speed (sample rate and bandwidth) and linearity of T/H circuits and amplifiers while simplifying the analog circuitry and clocking needed. These techniques comprehensively account for various memory, kick-back, and order-dependent effects in a unified framework.

39 Claims, 20 Drawing Sheets

(58) Field of Classification Search
USPC .......................................... 341/120, 131, 155
See application file for complete search history.

(56) References Cited

U.S. PATENT DOCUMENTS

| | | | |
|---|---|---|---|
| 6,771,203 | B1 | 8/2004 | Nairn |
| 6,900,750 | B1 | 5/2005 | Nairn |
| 7,250,885 | B1 | 7/2007 | Nairn |
| 7,253,762 | B2 | 8/2007 | Huang et al. |
| 7,312,734 | B2 | 12/2007 | McNeill |
| 7,482,956 | B2 | 1/2009 | Huang et al. |
| 8,233,069 | B2 * | 7/2012 | Kapusta .................... G06T 1/00 348/241 |
| 8,564,464 | B2 * | 10/2013 | Carreau ................. G11C 27/02 341/122 |
| 8,737,003 | B2 * | 5/2014 | Greene .................. G11C 27/02 360/51 |
| 8,890,729 | B2 | 11/2014 | Lewis et al. |
| 9,143,147 | B1 * | 9/2015 | Ray ..................... H03M 1/1023 |
| 9,294,112 | B1 | 3/2016 | Devarajan et al. |
| 2007/0026895 | A1 | 2/2007 | Capece et al. |
| 2010/0049483 | A1 | 2/2010 | Johansson et al. |
| 2011/0063149 | A1 | 3/2011 | Kidambi |
| 2014/0152478 | A1 | 6/2014 | Lewis et al. |

OTHER PUBLICATIONS

Murmann, *Digitally Assisted Data Converter Design*, 978-1-4799-0645-1/13, © 2013 IEEE, 8 pages.
Louwsma et al., *Chapter 2: Time-interleaved Track and Holds*, Analog Circuit and Signal Processing, DOI: 10.1007/978-90-481-9716-3_2 © 2011, 35 pages.
Duan, *Design Techniques for Ultra-High-Speed Time-Interleaved Analog-to-Digital Converters (ADCs)*, Electrical Engineering and Computer Sciences University of California at Berkley, May 1, 2017, 82 pages.
M. El-Chammas et al., *Chapter 2, Time-Interleaved ADCs—Background Calibration of Time—Interleaved Data Converters*, Analog Circuits and Signal Processing, DOI 10.1007/978-1-4614-1511-4_2 © Springer Science+Business Media, LLC 2012, ISBN 978-1-4614-1510-7, 27 pages.
Razavi, *Design Considerations for Interleaved ADCs*, IEEE Journal of Solid-State Circuits, vol. 48, No. 8, Aug. 2013, 12 pages.
Stepanovic, *Calibration Techniques for Time-Interleaved SAR A/D Converters*, Electrical Engineering and Computer Sciences University of California at Berkeley, Technical Report No. UCB/EECS-2012-225, Dec. 4, 2012, http://www.eecs.berkeley.edu/Pubs/TechRpts/2012/EECS-2012-225.html, 116 pages.
Elbornsson et al., *Analysis of Mismatch Noise in Randomly Interleaved ADC System*, Acoustics, Speech, and Signal Processing, 2003. Proceedings. (ICASSP '03). 2003 IEEE International Conference (vol. 6), Apr. 6-10, 2003, VI 277-80 vol. 6, ISBN 0-7803-7663-3, 5 pages(including Abstract).
Vogel et al., *A Novel Channel Randomization Method for Time-Interleaved ADCs*, IMTC 2005—Instrumentation and Measurement Technology Conference, Ottawa, Canada, May 17-19, 2005, 6 pages.
Vogel, *Comprehensive Error Analysis of Combined Channel Mismatch Effects in Time-Interleaved ADCs*, IMTC 2003—Instrumentation and Measurement Technology Conference, Vail, CO, USA, May 20-22, 2003, 6 pages.
Vogel, *Doctoral Thesis, Modeling, Identification, and Compensation of Channel Mismatch Error in Time-Interleaved Analog-to-Digital Converters*, Faculty of Electrical Engineering and Information Technology, Graz University of Technology, Austria, Graz, Jul. 2005, 226 pages.
Beydoun et al., *A Novel Digital Calibration Technique for Gain and Offset Mismatch in Parallel TΣΔ ADCs*, 978-1-4244-4296-6/10 © 2010 IEEE, ICASSP 2010, 4 pages.
Razavi, *Problem of Timing Mismatch in Interleaved ADCs*, Electrical Engineering Department, University of California, Los Angeles, ISBN 978-1-4673-1556-2/12, © 2012 IEEE, 8 pages.
Elbornsson et al., *Analysis of Mismatch Effects in Randomly Interleaved A/D Converter System*, Control & Communication, Department of Electrical Engineering, Linkopings University, Linkoping, Sweden, Mar. 3, 2003, 14 pages.
Soudan et al., *Methodology for Mismatch Reduction in Time-Interleaved ADCs*, 1-4244-1342-7/07, © 2007, IEEE, 4 pages.
Vogel, *The Impact of Combined Channel Mismatch Effects in Time-Interleaved ADCs*, IEEE Transactions on Instrumentation and Measurement, vol. 54, No. 1, Feb. 2005, 13 pages.
Huawen Jin, Time-Interleaved A/D Converter with Channel Randomization, 0-7803-3583-x/97 © 1997, IEEE, 4 pages.

* cited by examiner

CALIBRATING TIME-INTERLEAVED SWITCHED-CAPACITOR TRACK-AND-HOLD CIRCUITS AND AMPLIFIERS

PRIORITY APPLICATION

This patent application claims priority to and receives benefit from U.S. Provisional Application, Ser. No. 62/648, 863, titled "CALIBRATING TIME-INTERLEAVED SWITCHED-CAPACITOR TRACK-AND-HOLD CIRCUITS AND AMPLIFIERS", filed on Mar. 27, 2018, which is hereby incorporated in its entirety.

TECHNICAL FIELD OF THE DISCLOSURE

The present disclosure relates to the field of integrated circuits, in particular to background calibration of memory, kick-back, and order-dependent errors in interleaved switched-capacitor track-and-hold circuits and amplifiers.

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing circuitry in ADC is a non-trivial task because each application may have different needs in performance, power, cost, and size. ADCs are used in a broad range of applications including Communications, Energy, Healthcare, Instrumentation and Measurement, Motor and Power Control, Industrial Automation and Aerospace/Defense. As the applications needing ADCs grow, the need for fast, low power, and accurate conversion also grows.

BRIEF DESCRIPTION OF THE DRAWINGS

To provide a more complete understanding of the present disclosure, features and advantages thereof, reference is made to the following description, taken in conjunction with the accompanying figures, wherein like reference numerals represent like parts, in which.

DETAILED DESCRIPTION

Overview

Background calibration techniques can effectively to correct for memory, kick-back, and order-dependent errors in interleaved switched-capacitor track-and-hold (T/H) circuits and amplifiers. The techniques calibrate for errors in both the track/sample phase and the hold-phase, and account for the effects of interleaving, buffer/amplifier sharing, incomplete resetting, incomplete settling, chopping, and randomization on the offset, gain, memory, and kick-back errors. Moreover, the techniques can account for order-dependent and state-dependent hold-phase non-linearities. By correcting for these errors, the proposed techniques improve the noise performance, linearity, gain/offset matching, frequency response (and bandwidth), and order-dependent errors. The techniques also help increase the speed (sample rate and bandwidth) and linearity of T/H circuits and amplifiers while simplifying the analog circuitry and clocking needed. These techniques comprehensively account for various memory, kick-back, and order-dependent effects in a unified framework.

High Speed ADCs and Their Front-End Circuitry

ADCs are electronic devices that convert a continuous physical quantity carried by an analog signal to a digital output or number that represents the quantity's amplitude (or to a digital signal carrying that digital number). An ADC can be defined by the following application requirements: its speed (number of samples per second), its power consumption, its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio SINAD, effective number of bits ENOB, signal-to-noise ratio SNR, total harmonic distortion THD, total harmonic distortion plus noise THD+N, and spurious free dynamic range SFDR. ADCs have many different designs, which can be chosen based on the application requirements and specifications.

High speed ADCs, typically running at speeds on the order of giga-samples per second, are particularly important in fields such as communications and instrumentation. The input signal can have a frequency in the giga-Hertz range, and the ADC may need to sample in the range of giga-samples per second. High frequency input signals can impose many requirements on the circuits receiving the input signal, i.e., the "front-end" circuitry of the ADC. The circuit not only has to be fast, for some applications, the circuit needs to meet certain performance requirements, such as SNR and SFDR. Designing an ADC that meets speed, performance, area, and power requirements is not trivial, since faster speeds and higher performance often come at the cost of area and power.

Figure 1:
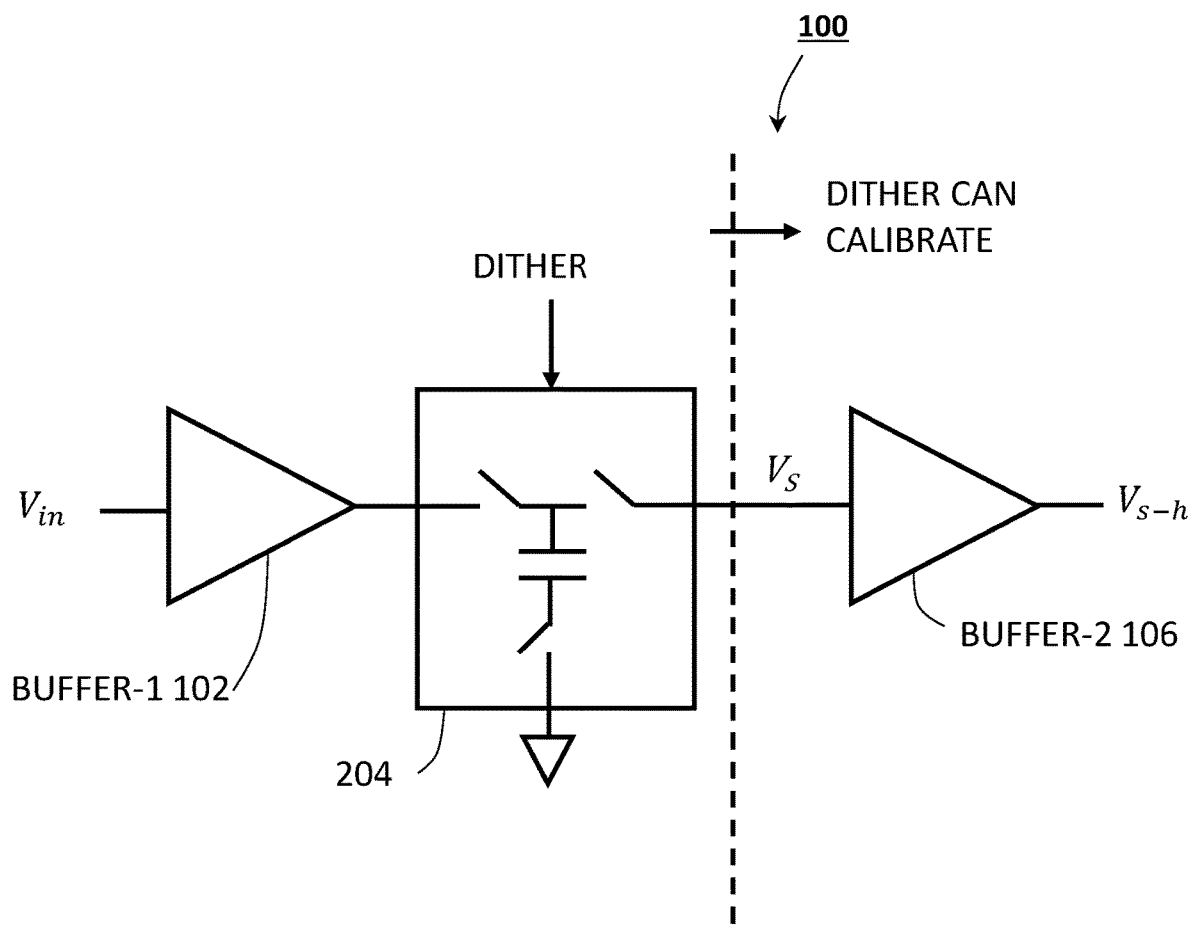
FIG. 1 shows an exemplary track-and-hold circuit.

Track-and-hold (T/H) circuits is a part of the input circuitry for certain ADCs. T/H circuits convert the continuous-time input signal into a discrete-time held signal for the ADC(s) which follow the T/H circuits. The ADC(s) can perform conversion based on the discrete-time held signal provided by the T/H circuit. A fast T/H circuit can be non-trivial to design. High speed T/H circuits can, in some cases, suffer from very high power consumption, high noise, and low performance. FIG. 1 shows an exemplary T/H circuit 100 having two buffers, Buffer-1 102, and Buffer-2 106 and a switched-capacitor network 104 in between the two buffers. The switched-capacitor network 104 can be a sampling network. Buffer-1 102 can be a sampling buffer, and Buffer-2 106 can be a hold buffer. Dither can be injected in the switched-capacitor network 104, and the dither can be used to calibrate the Buffer-2 106 and the ADC(s) following the T/H circuit 100. The dither can be an additive dither or a multiplicative dither. The Buffer-1 102 receives the (voltage) input $V_{in}$, and buffers the input. The buffered input can be sampled on the switched-capacitor network 104. For instance, the switched-capacitor network 104 can sample the buffered input onto capacitor(s) using suitable switches. The buffer-2 106 can buffer the sampled input and provided the held signal $V_{s-h}$ to an ADC (not shown in FIG. 1).

Dither can be injected into a node of the switched-capacitor network 104 of the T/H circuit 100 in various manners. A dither is a random signal. A dither can have different levels. In one example, a dither can be generated by a digital-to-analog converter receiving a digital input (the dither in digital form) and generating an analog output (the dither in analog form). The analog output from the digital-to-analog converter can be injected into the switched-capacitor network of a T/H circuit. In another example, a dither can be generated using a dither capacitor charged to a dither voltage, and a switch to connect the dither capacitor to a (summing) node of the switched-capacitor network 104. In some cases, a dither can randomly change between positive or negative (e.g., randomly changing between +1, and −1, or +V or −V where V is a nominal value). The type of dither being injected can differ depending on the desired calibration to be performed or effect to be achieved. There can be more than one dither signal injected in the switched-capacitor network 104. A dither signal can be additive or multiplicative.

If it is difficult to implement a full-speed sampling network to sample the input signal, a T/H circuit can be adapted to implement time-interleaving. Rather than having a single switched-capacitor network to sample the input signal, multiple switched-capacitor networks (or sampling networks) can be implemented in the T/H circuit and interleaved in time.

Selection or sequence of switched-capacitor networks being used for a series of time periods can be sequential (e.g., rotation), or randomized (e.g., one out of at least two available/idle switched-capacitor networks is selected at random for sampling the signal during a next time period).

Figure 2:
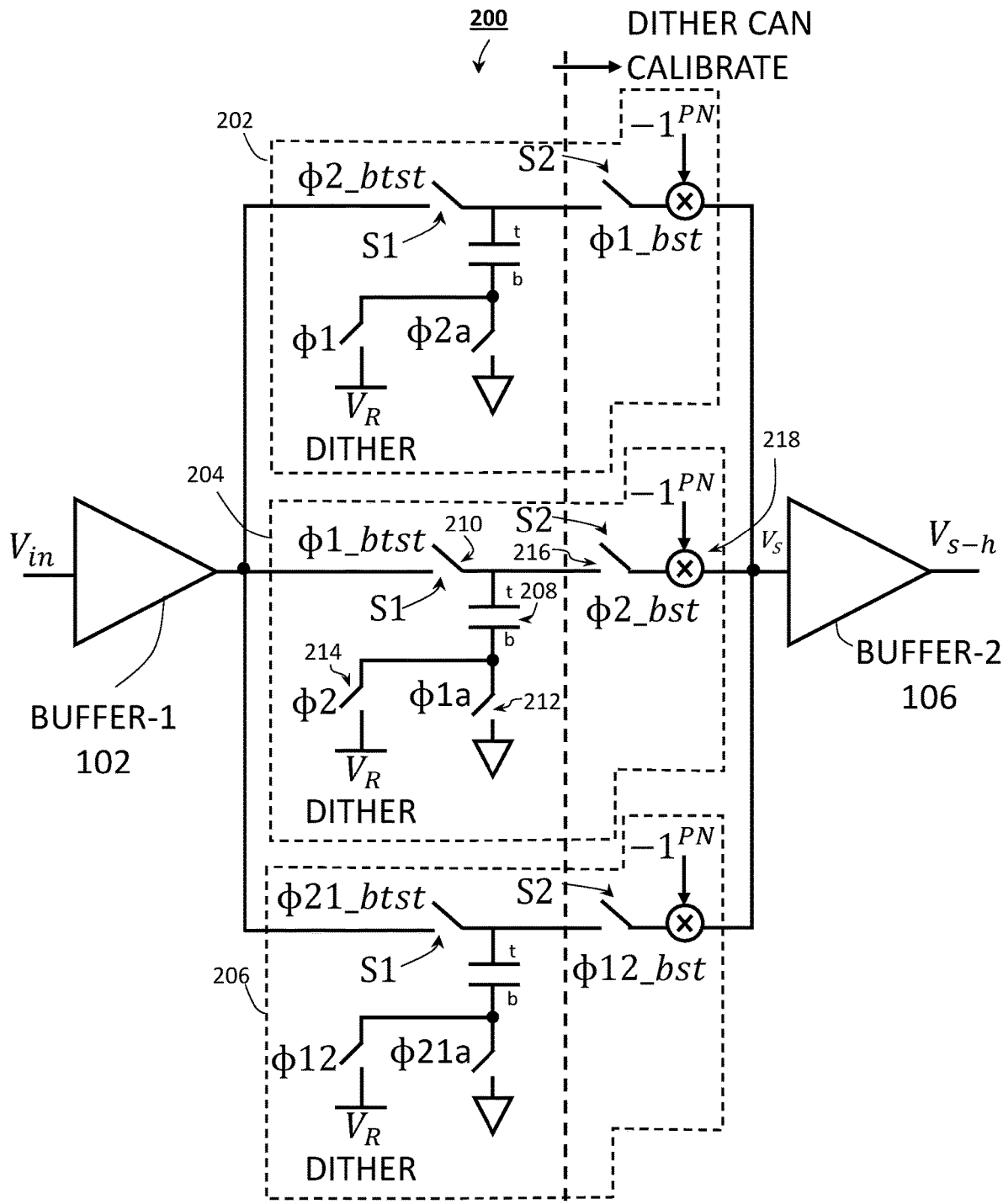
FIG. 2 shows an exemplary track-and-hold circuit with multiple sampling networks, according to some embodiments of the disclosure.

FIG. 2 shows an exemplary T/H circuit 200 with multiple sampling networks, according to some embodiments of the disclosure. The T/H circuit 200 has a Buffer-1 102, sampling network 202, sampling network 204, sampling network 206, and a Buffer-2 106. Sampling network 202, sampling network 204, and sampling network 206 are non-inverting sampling networks. To achieve higher overall sampling rate, sampling network 202, sampling network 204, and sampling network 206 can operate in a time-interleaved fashion. In other words, sampling network 202, sampling network 204, and sampling network 206 can sample the signal at the output of Buffer-1 102 one after another. With M time-interleaved sampling networks and a full sampling frequency $f_s$, one interleaved sampling network can run at a sampling frequency of $f_s/M$, while M time-interleaved sampling networks together can achieve the full sampling frequency $f_s$.

Circuitry in sampling network 204 is described in the following passages in greater detail. It is envisioned by the disclosure that sampling network 202 and sampling network 206 can be implemented in the same fashion as the sampling network 204.

The circuitry in sampling network 204 includes sampling capacitor 208 (or sampling capacitance) for sampling the input, an input switch 210 (labeled "S1") for receiving the (buffered) input from Buffer-1 102, a sampling switch 212, a dither injection switch 214, an output switch 216 (labeled "S2"), and random chopper 218.

During track-/sampling-phase, the input switch 210 controlled by phase φ1_btst and the sampling switch 212 having phase φ1a are closed. The input switch 210 can be a bootstrapped switch to achieve good linearity. The sampling switch 212 having φ1a is advanced (opens before the input switch 210 is opened) to achieve bottom plate sampling. At the end of the track-/sampling-phase, the input signal is sampled onto capacitor 208, and both the input switch 210 having phase φ1_btst and the sampling switch 212 having phase φ1a are opened.

During hold-phase, dither injection switch 214 having phase φ2 closes to connect the bottom plate of the capacitor 208 to the node $V_R$ (having a dither voltage $V_R$). Accordingly, additive dither can be injected in the switched-capacitor network. Output switch 216 having phase φ2_btst also closes. Optionally, the output switch 216 can be a bootstrapped switch to achieve good linearity.

In addition to injecting additive dither, a random chopper, e.g., random chopper 218, can randomly chop the input signal by randomly changing polarities based on a pseudo-random code "PN". Mathematically, the signal is multiplied with a dither represented by $-1^{PN}$, where PN is a pseudo-random code. The pseudo-random code PN can have sequence of randomized values of 0 and 1. In other words, the sampling network 204 can have multiplicative dither injected, where the dither, e.g. $-1^{PN}$, can have a value of +1 or −1, as chosen by the code PN. The multiplicative dither can be injected by random chopper 218, during the hold-phase. Effectively, a random chopper can multiply the signal in the signal path randomly by $-1^{PN=0}=+1$ or $-1^{PN=1}=-1$. The code PN can dictate/define the state of the random chopper, which can be represented by a bit PN (its negated version is represented as PN'). Specifically, when PN=0, the polarity is unchanged. When PN=1, the polarity is changed.

In some cases, random chopper 218 performing a chopping function can be integrated with a switch in the sampling network, such as the output switch "S2". As shown in FIG. 2, a chopper is integrated with the output switches labeled "S2" associated with φ1_bst, φ2_bst, and φ12_bst (e.g., output switch 216 in sampling network 204). In the alternative, the chopping function can be integrated with the input switches labeled S1 associated with φ1_btst, φ2_btst, and φ12_btst (e.g., input switch 210 in sampling network 204). The former has the additional advantage that the chopper can be calibrated by the additive dither, if desired. It is understood that while the chopping function can be integrated with a switch that is in the sampling network, it is possible to include a chopping at any point in the signal path, such as at the output of Buffer-1 102.

This chopping can then be reapplied on the digital side after offset calibration to restore the original signal. Random chopping is further described in relation to FIG. 4.

Random chopping can be useful for offset mismatch calibration, where the chopping function can convert any input offset and/or signals at problematic frequencies (such as $f_s/M$, and $f_s/2M$, where M is the number of slices) into noise, e.g., so as to not impact the offset convergence and removal of the offset. Chopping can also help with even-order distortions or to reduce even-order harmonics in the signal path.

Sampling network 204 can have two bootstrapped switches (one bootstrapped input switch S1 and one bootstrapped output switch S2), which can be more complicated and expensive. However, having the two bootstrapped switches can provide better isolation, and can enable using more than one sampling network (e.g., more than one switched-cap network sampling in an interleaved fashion) with the same Buffer-2 106. Output switch 216 does not have to be bootstrapped, since the dither being injected can be used to calibrate output switch 216. If indeed the output switch 216 is bootstrapped, then calibration may not be needed since the output switch 216 is linear enough. If the output switch 216 is not bootstrapped (just boosted), then calibration can be used to address non-linearities of the output switch 216.

Sampling network 202 and sampling network 206 can have similar/same circuitry as sampling network 204, but the input and output switches are controlled by different phases to implement time-interleaving.

The T/H circuit 200 can then hold the sampled voltage plus any dither injected at the output as $V_{s-h}$. In this embodiment, the output bias point of Buffer-1 102 is preferably compatible with the input bias point of Buffer-2 106.

The output $V_{s-h}$ is a non-inverted version of the input $V_{in}$ plus any dither injected at node $V_R$.

Figure 3:
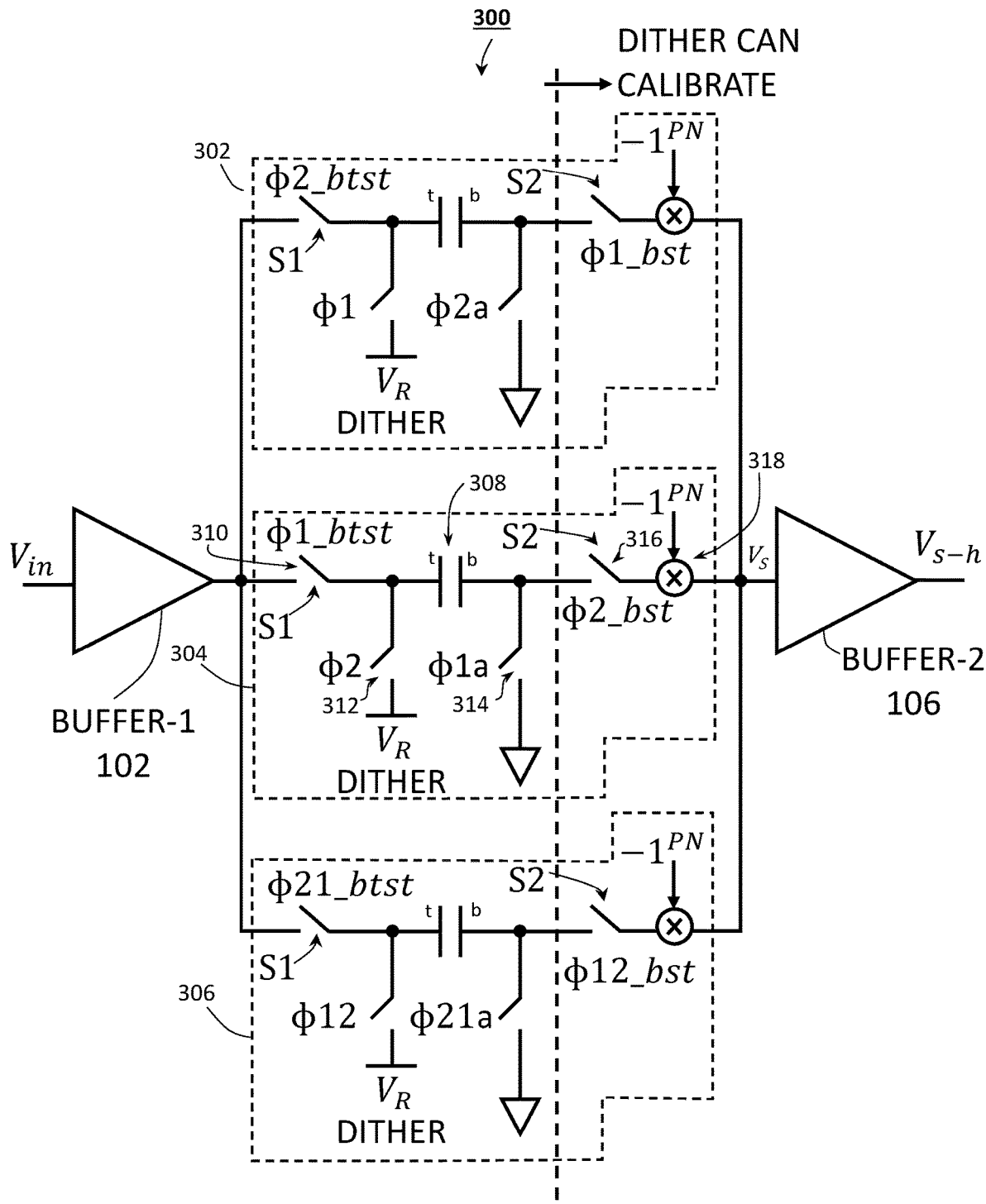
FIG. 3 shows another exemplary track-and-hold circuit with multiple sampling networks, according to some embodiments of the disclosure.

FIG. 3 shows an exemplary T/H circuit 300 with multiple sampling networks, according to some embodiments of the disclosure. The T/H circuit 200 has a Buffer-1 102, sampling network 302, sampling network 304, sampling network 306, and a Buffer-2 106. Sampling network 302, sampling network 304, and sampling network 306 are inverting sampling networks (the difference from the T/H circuit 200 of FIG. 2). To achieve higher overall sampling rate, sampling network 302, sampling network 304, and sampling network 306 can operate in a time-interleaved fashion. In other words, sampling network 302, sampling network 304, and sampling network 306 can sample the signal at the output of Buffer-1 102 one after another. With M time-interleaved sampling networks and a full sampling frequency $f_s$, one interleaved sampling network can run at a sampling frequency of $f_s/M$, while M time-interleaved sampling networks together can achieve the full sampling frequency $f_s$.

Circuitry in sampling network 304 is described in the following passages in greater detail. It is envisioned by the disclosure that sampling network 302 and sampling network 306 can be implemented in the same fashion as the sampling network 204.

The circuitry in sampling network 304 includes sampling capacitor 308 for sampling the input, an input switch 310 (labeled "S1") for receiving the (buffered) input from Buffer-1 102, a sampling switch 314, a dither injection switch 312, an output switch 316 (labeled "S2"), and random chopper 318.

During track-/sampling-phase, the input switch 310 (labeled "S1") having phase φ1_btst and the sampling switch 314 having phase φ1a are closed. The input switch 310 can be a bootstrapped switch to achieve good linearity. The sampling switch having φ1a 312 is advanced (opens before the input switch 310 is opened) to achieve bottom plate sampling. At the end of the track-/sampling-phase, the input signal is sampled onto capacitor 308, and both the input switch 310 having phase φ1_btst and the sampling switch 314 having phase φ1a are opened.

During a hold-phase, dither injection switch 312 having phase φ2 closes to connect the top plate of the capacitor 308 to the node $V_R$ (having a dither voltage $V_R$). Accordingly, additive dither can be injected in the switched-capacitor network. Output switch 316 having phase φ2 also closes. In some cases, the output switch 316 can be a bootstrapped switch to achieve good linearity. Bootstrapping the output switch 316 is less critical in this case since the output switch 316 can be calibrated using the dither being injected. The multiplicative dither is injected by random chopper 318, during the hold-phase. Benefits of the random chopper 318 are the same as the benefits of the random chopper 218 as discussed in FIG. 2.

Sampling network 302 and sampling network 306 can have similar/same circuitry as sampling network 304, but the input and output switches are controlled by different phases to implement time-interleaving. The T/H circuit 300 holds the sampled voltage plus any dither injected at the output as $V_{s-h}$. In this embodiment, the output bias point of Buffer-1 102 does not need to be compatible with the input bias point of Buffer-2 106. The output $V_{s-h}$ is an inverted version of the input $V_{in}$ plus any dither injected at node $V_R$.

Figure 4:
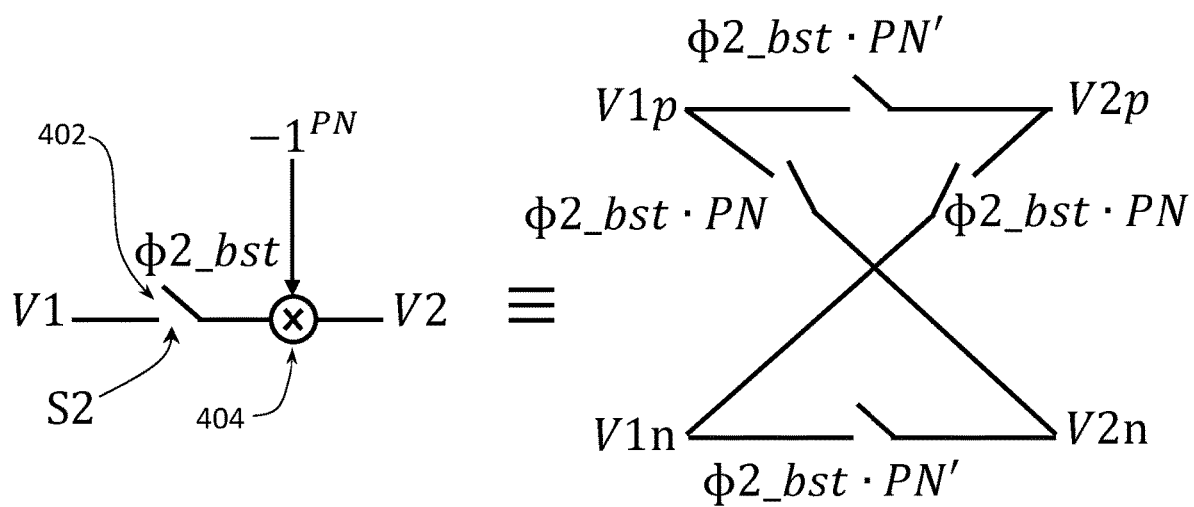
FIG. 4 illustrates an output switch and a chopper, according to some embodiments of the disclosure.

FIG. 4 illustrates an output switch and a chopper, according to some embodiments of the disclosure. For illustration, on the left hand side of the FIGURE, an output switch S2 402 associated with phase φ2_bst is shown, followed with a chopper 404. Mathematically, the signal is multiplied with a dither value represented by $-1^{PN}$ by random chopper 404, where PN is a pseudo-random code dictating the state of the random chopper.

The chopping function can be achieved in a differential circuit implementation seen on the right hand side of the FIGURE. In a differential circuit, the node V1 on the left hand side of the FIG. 4 is represented by differential nodes V1*p* and V1*n* respectively on the right hand side of the FIG. 4. The node V2 on the left hand side of the FIG. 2 is represented by differential nodes V2*p* and V2*n* respectively on the right hand side of the FIG. 2. The circuit has straight forward paths and crisscross paths. The switches in these paths enables random switching between the straight forward paths and crisscross paths, based on the value/state of PN. In other words, the multiplicative dither can randomly swap positive and negative input paths. The straight forward paths with switches associated with φ2_bst*PN', are closed when PN=0, and PN'=1. The switches, when closed, allows the differential signal at nodes V1*p* and V1*n* to pass straight through to nodes V2*p* and V2*n* respectively, without changing the polarity of the differential signal. This means that the multiplicative dither value being applied in this case was $-1^{PN=0}$=+1. The crisscross paths with switches associated with φ2_bst*PN are closed when PN=1, and PN'=0. The switches, when closed, invert the differential signal at nodes V1*p* and V1*n* and pass the differential signal to nodes V2*n* and V2*p* respectively, changing the polarity of the differential signal. This means that the multiplicative dither value being applied in this case was $-1^{PN=1}$=-1.

Effectively, the multiplicative dither can randomly swap positive and negative input paths. By randomly swapping the positive and negative input paths, the DC (direct current) component of the input signal can be randomized, making it easier to calibrate for any offset mismatches between the different slices.

The chopping function can be implemented with the input switch "S1", which can randomly invert the signal in the track-/sampling-phase. The chopping function can be implemented with the output switch "S2", which can randomly invert the signal in the hold-phase.

Referring back to the time-interleaved sampling networks of FIGS. 2 and 3, one skilled in the art can appreciate that the speed of a single time-interleaved sampling network can be significantly reduced when compared to using just a single sampling network. While three sampling networks are shown, it is appreciated that generally two or more sampling networks can be time-interleaved or included in the T/H circuit, depending on the desired order of interleaving and mode of interleaving operation for the application.

With time-interleaved sampling networks, the T/H circuit can be exposed to mismatches between the time-interleaved sampling networks. For instance, mismatches between the sampling switches enabling bottom plate sampling can contribute to track-/sampling-phase performance degradation if the mismatches are not addressed. Specifically, those mismatches can create undesirable spurs in the output. Unfortunately, the dither cannot help with calibrating such mismatches.

To address such mismatches, having a third sampling network or other additional sampling network(s) can be can enable randomization. At any given period, two or more sampling networks may be available for sampling the input. One of the two or more sampling networks can be selected to sample the input at random. Randomizing the sampling network can randomize the mismatches between the sampling networks, and push the tones from the mismatches towards the noise floor.

In some embodiments, adding more sampling networks can enable higher order time-interleaving, or more functions. For instance, more randomization can be introduced by providing more sampling networks, making more sampling networks available for selection at a given period. With more randomization, the tones would appear more like white noise (less coloration).

In some cases, a fourth or further sampling network can be added to enable the resetting of each network after its hold-phase and before being ready for the next track-/sampling-phase. In other words, a sampling network proceeds to a reset phase after the hold-phase to allow the circuits to clear (a sampling network may need three periods rather than just two periods before it can sample the input again). For instance, an additional (fourth) sampling network can be included provided to ensure there is at least two available sampling networks to select from at a given period to be the next sampling network to sample the input. Having an additional sampling network allows a given sampling network to take an additional period to reset before the given sampling network has to sample the input again. Providing the additional reset phase can help to get reduce or address the memory effects and/or order-dependent effects that can be detrimental to the performance of the T/H circuit, especially when randomization is employed. But adding further sampling networks can increase complexity, area, and power consumption.

In some cases, the time-interleaving sampling networks of a T/H circuit can be configured to operate in different modes of operation. For instance, the clocking of the switches in the sampling networks can be controlled differently depending on the specified mode. The sampling networks can be configured/controlled to operate in a sequential mode or a randomized mode. The sampling network can be configured/controlled operate in a mode that requires a reset phase or in a mode that does not require a reset phase. The desired mode can be specified by one or more user-provided signals, or one or more signals from circuitry suitable for setting the mode.

Open-loop T/H and amplifier circuits are important building blocks that are used in low power ADCs. As illustrated by FIGS. 2-3, interleaving the sampling networks is possible to increase the sampling rate of a T/H circuit. The T/H circuits can be seen as an open-loop T/H circuits. The buffers are optional, and can be included to provide isolation between different circuit stages. The buffers can be source followers, emitter followers, push pull topology, or any other suitable buffer structure. In some cases, one or more of the buffers can be implemented as an amplifier, or variable gain amplifier. The amplifier can be closed-loop or open-loop. If the buffers are replaced by open-loop amplifier with a gain larger than 1, the circuit can act an amplifier.

In some cases, buffers/amplifiers of the T/H circuits can be shared among the different paths/cores/slices/channels which may follow the T/H circuit (as shown in FIGS. 2-3), meaning one single hold buffer drives multiple paths/cores/slices/channels.

In some embodiments, rather than having a single hold buffer as seen in FIGS. 2-3, multiple hold buffers can be included in the T/H circuit. Phrased differently, the hold buffer (i.e., Buffer-2 106 in FIGS. 1-3) can be split into multiple hold buffers. When multiple hold buffers are used, the T/H circuit can be adapted to drive multiple paths/cores/slices/channels (e.g., multiple ADCs). For instance, instead of having a single hold buffer (i.e., Buffer-2 106 of FIGS. 1-3) driving multiple paths/cores/slices/channels, the T/H circuit can duplicate the hold buffer, and plurality of hold buffers can then drive respective paths/cores/slices/channels.

Figure 5:
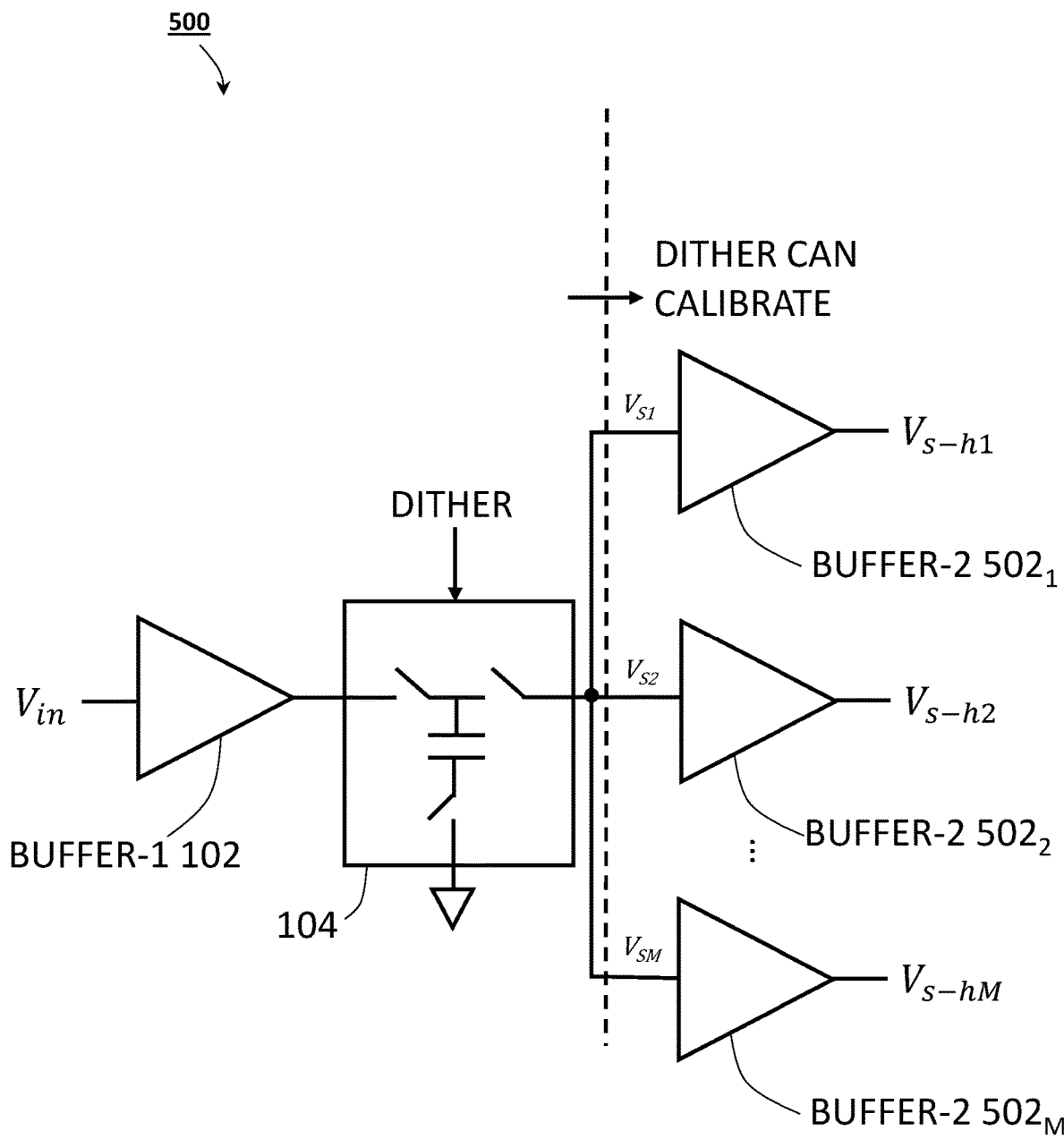
FIG. 5 shows an exemplary track-and-hold circuit with multiple hold buffers, according to some embodiments of the disclosure.

FIG. 5 shows an exemplary track-and-hold circuit with multiple hold buffers, according to some embodiments of the disclosure. The multiple hold buffers are shown as Buffer-2 502$_1$, Buffer-2 502$_2$, ... Buffer-2 502$_M$, according to some embodiments of the disclosure. Similar to T/H circuit 100 of FIG. 1, the T/H circuit 500 has a sampling buffer Buffer-1 102 and a switched-capacitor network 104. Rather than having just one hold buffer, M hold buffers can be implemented in T/H circuit 500 to drive M paths/cores/slices/channels. Each one of the hold buffers can generate a respective output signal $V_{s-h1}$, $V_{s-h2}$, ... $V_{s-hM}$, and drive respective paths/cores/slices/channels. Since the hold buffer no longer has to drive multiple paths/cores/slices/channels, the Buffer-2 502$_1$, Buffer-2 502$_2$, ... Buffer-2 502$_M$ can be smaller in size than a single hold buffer driving multiple paths/cores/slices/channels. In other words, not having to drive multiple paths/cores/slices/channels using a single hold buffer can relax the requirements on the hold buffer. Besides, the hold buffer can be calibrated using the dither being injected into the sampling network. Therefore, the requirements on the hold buffer may be relaxed further due to calibration. Furthermore, having multiple hold buffers can help the T/H circuit 500 have better isolation between the different paths/cores/slices/channels.

Figure 6:
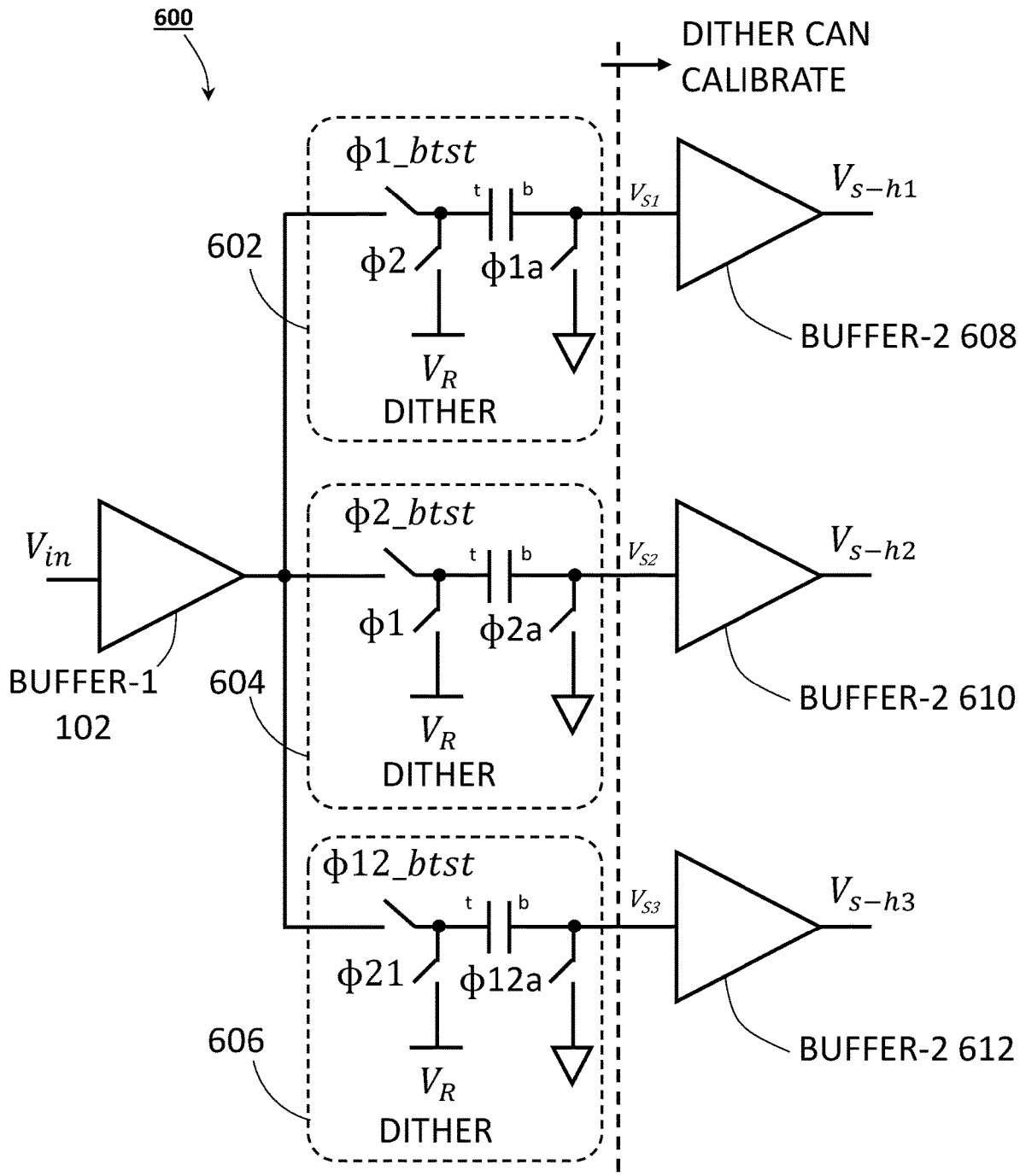
FIG. 6 shows another exemplary track-and-hold circuit with multiple sampling networks and multiple hold buffers, according to some embodiments of the disclosure.

FIG. 6 shows another exemplary track-and-hold circuit with multiple sampling networks and multiple hold buffers, according to some embodiments of the disclosure. When multiple time-interleaved sampling networks are included, sampling network 602, sampling network 604, and sampling network 606 (which, in some embodiments, can be implemented similarly to the embodiments illustrated in FIGS. 2-3) can each drive hold buffer 608, hold buffer 610, and hold buffer 612, respectively. A sampling network per hold buffer can be implemented. For instance, such adapted T/H circuit 600 driving M paths/cores/slices/channels can include a sampling buffer, M sampling networks, and M hold buffers. Having multiple hold buffers can provide better isolation between paths/cores/slices/channels, and can reduce design requirements imposed on the individual hold buffers (with similar benefits as the example seen in FIG. 5). Each sampling network has a dedicated hold buffer to drive the paths/cores/slices/channels, which follows the hold buffer. With a dedicated hold buffer, the sampling networks can avoid having an output switch. Each one of the hold buffers can generate a respective output signal (shown as $V_{s-h1}$, $V_{s-h2}$, and $V_{s-h3}$) and drive a respective paths/cores/slices/channels. A chopper (not shown) can be included in a sampling network to inject a multiplicative dither, if desired.

Nature of Errors for Certain T/H Circuits

In some cases, it is possible to reset of the capacitances and buffers in the T/H circuit to remove memory and kick-back errors. However, this resetting requires time, and can in some cases, reduce the time available for the sampling/track and hold phases. Resetting also requires complicated clocks that consume additional power. While it is possible to add an additional network/track to allow for resetting can in an additional phase, adding an additional network/track would increase the power consumption in the buffer and the clocking needed. It would also increase the number of networks/tracks by one or more network/tracks, which has other detrimental effects. Moreover, even with complete resetting, some order-dependent residual errors that depend on the present and previous/past states can still exist and can cause degradation in performance.

Calibrating for memory and kick-back errors is not trivial. In particular, some of the T/H circuits described herein can exhibit interactions that complicate the memory and order-dependent behavior, especially in the presence of path-randomization and chopping, and more so when the active circuits (e.g., buffers and/or amplifiers) are shared among the different interleaved tracks. Randomization and chopping spread the memory and kick-back errors in the noise floor, and can substantially degrade the SNR. In addition, they can cause order-dependent effects that are otherwise non-existent. Random chopping can cause state-dependent effects as well. It would be desirable to calibrate for these effects in the presence of randomized time-interleaving, chopping, and buffer/amplifier sharing.

Techniques that calibrate the memory and kick-back errors in T/H and amplifier circuits in the presence of dither, randomized time-interleaving, chopping, and buffer/amplifier sharing are described in the following sections. These techniques are also extended to calibrate for the order-dependence of the memory, kick-back, offset, and gain errors. The techniques can also calibrate order-dependent and state-dependent non-linearities. Furthermore, these techniques can be used to calibrate a variety of T/H circuit, including interleaved T/H circuits, and amplifier structures (open-loop and closed-loop). It is desirable to correct for the effects of memory, kick-back and order-dependence in the digital domain, while relaxing the analog design to maximize speed and lower power consumption. These techniques make use of the injected dither signals to detect and correct the memory and kick-back errors in both the track-phase and hold-phase. The techniques also account for the dependence of the errors on one or more of the following: the present track network, the previous track network(s), the present hold network(s), the previous hold network(s), the present chopper state(s), the previous chopper state(s), and the randomization order.

Referring back to FIGS. 2 and 3, the T/H circuit 200 of FIG. 2 is a non-inverting T/H circuit and the T/H circuit 300 of FIG. 3 is an inverting T/H circuit (where the output is an inverted version of the input). For the top track in FIGS. 2 and 3 (having sampling network 202 or sampling network 302), the input is sampled during φ2 (φ2_btst) and held during φ1. The held signal is randomly chopped using the structure shown in FIG. 4, and dither is injected on the top or bottom plate of the sampling capacitor during the hold-phase. For the middle track (having sampling network 204 or sampling network 304), the input is sampled during φ1 (φ1_btst) and held during φ2. The held signal is randomly chopped using the structure shown in FIG. 4, and dither is injected on the top or bottom plate of the sampling capacitor during the hold-phase. The bottom track (having sampling network 206 or sampling network 306) is used to enable randomization, and the phases φ1 and φ2 are randomly switched among the three networks. Randomization (or random shuffling of the track networks) is employed to randomize any residual interleaving mismatch errors.

Some of the embodiments which follow may assume an inverting T/H circuit as illustrated in FIG. 3. However, the teachings can also apply to the non-inverting T/H circuit as illustrated in FIG. 2, and to the other variants of the T/H circuit as well.

Addressing Hold-Phase Errors

In the hold-phase, the sampling capacitor is connected to the input of the hold buffer $V_s$, and the other side of the capacitance can be connected to a dither voltage as shown in FIG. 3. The input voltage $V_s$ of Buffer-2 106 can be given roughly by the voltage division between the sampling capacitor C and the capacitance at the input of the Buffer-2 106, $C_p$. In the presence of dither, the input voltage $V_s$ of Buffer-2 106 can be given by:

$$V_s[n] = \frac{-V_{incap}[n]C}{C_t} + \frac{V_s[n-1]C_p}{C_t} + \frac{V_d[n]C}{C_t} \quad (1)$$

$V_{incap}$ is the input sampled on the sampling capacitor C, $V_d$ is the dither voltage, C is the total sampling capacitance of the sampling capacitor, $C_p$ is the parasitic capacitance at the summing node (i.e., input of the Buffer-2 106), and $C_t$ is the total capacitance connected to the summing node. That is:

$$C_t = C + C_p \quad (2)$$

Figure 7:
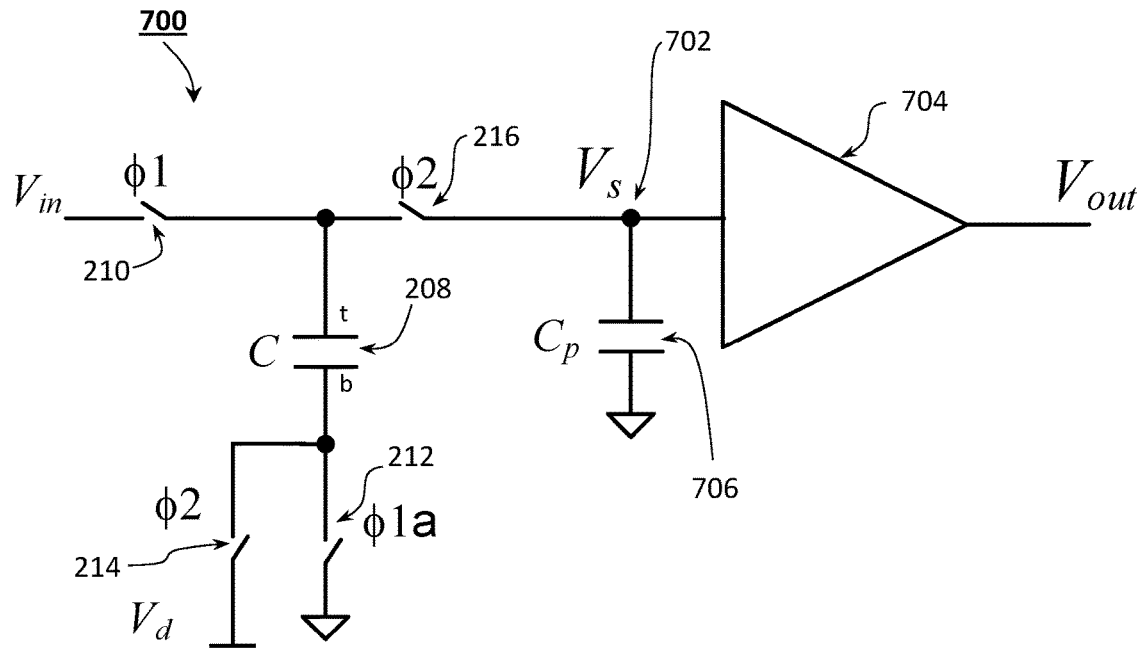
FIG. 7 shows a simplified schematic of an open-loop circuit for a non-inverting track-and-hold circuit, according to some embodiments of the disclosure.

FIG. 7 shows a simplified schematic of an open-loop circuit 700 for a non-inverting T/H circuit, according to some embodiments of the disclosure. The open-loop circuit 700 has summing node 702, hold buffer 704, and parasitic capacitance $C_p$ 706. The operations of the switches are previously described with respect to FIG. 2.

Figure 8:
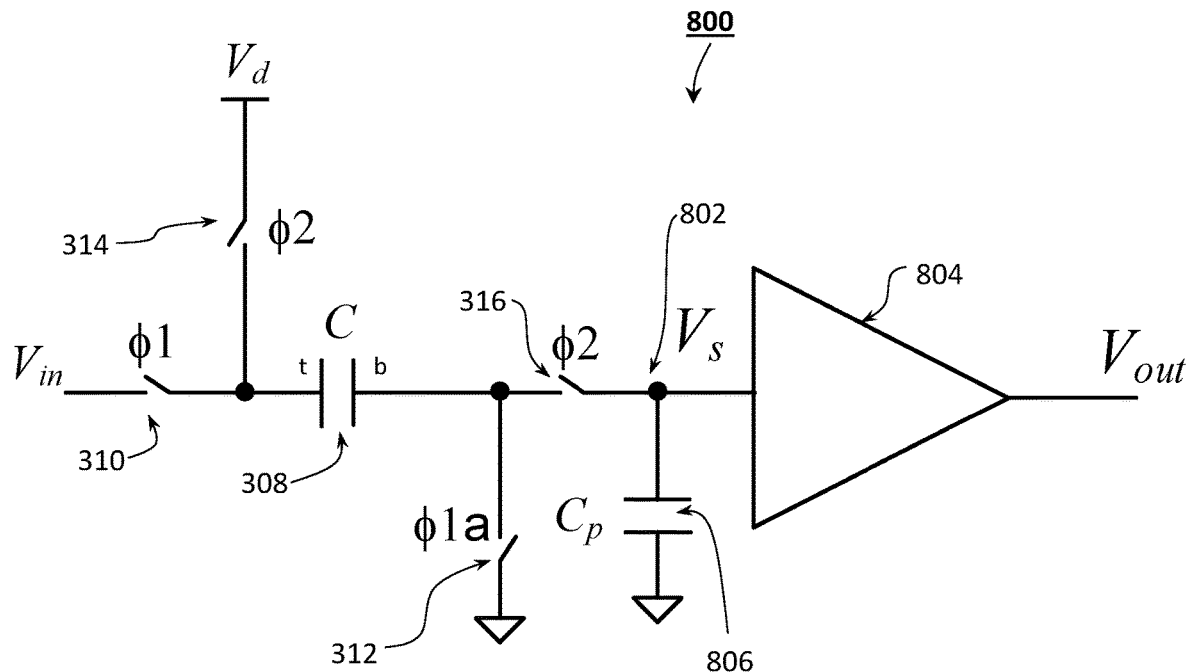
FIG. 8 shows a simplified schematic of an open-loop circuit for an inverting track-and-hold circuit, according to some embodiments of the disclosure.

FIG. 8 shows a simplified schematic of an open-loop circuit for an inverting T/H circuit, according to some embodiments of the disclosure. The open-loop circuit 800 has summing node 802, hold buffer 804, and parasitic capacitance $C_p$ 806. The operations of the switches are previously described with respect to FIG. 3.

Figure 9:
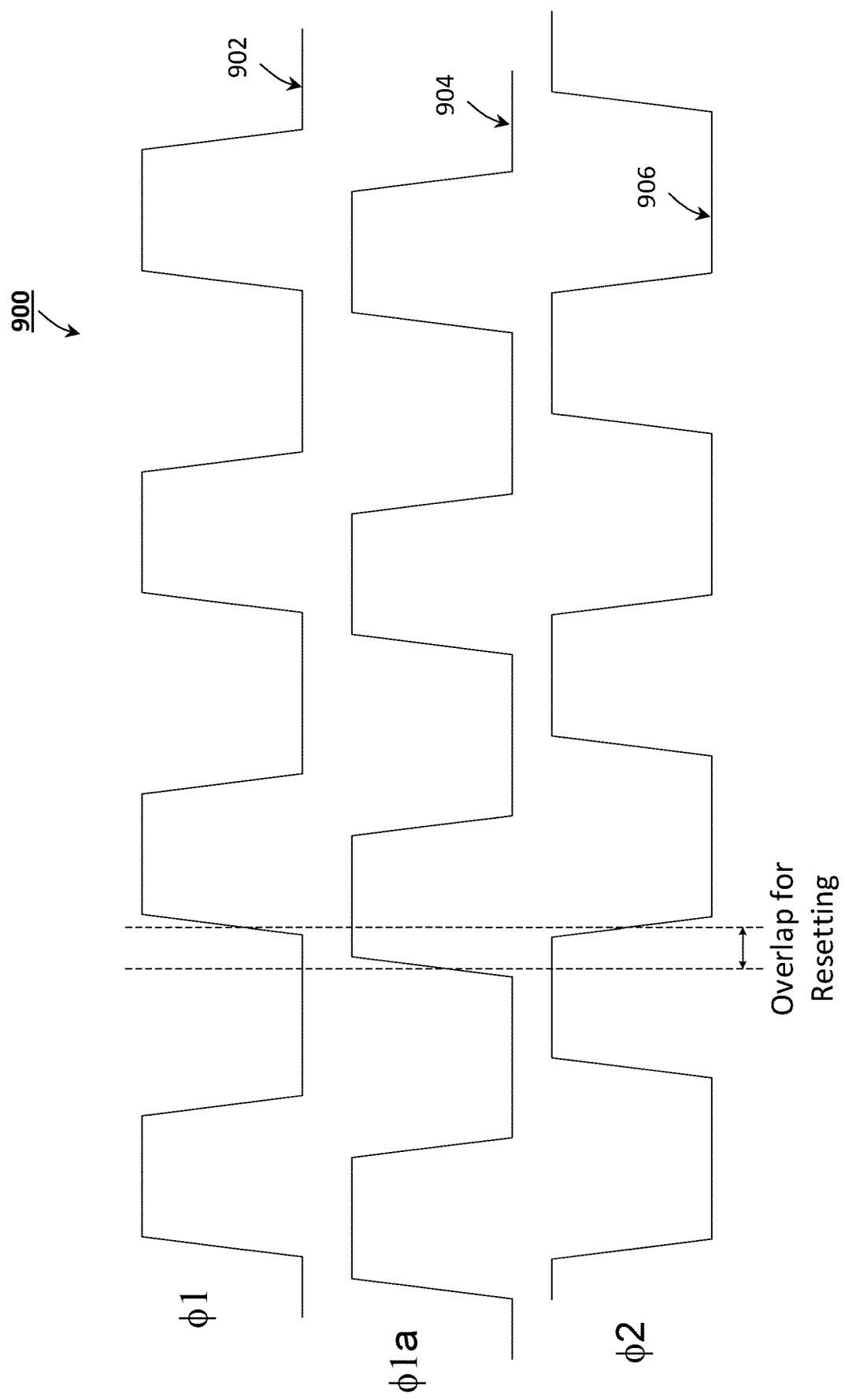
FIG. 9 shows a timing diagram 900 for a track-and-hold circuit, according to some embodiments of the disclosure.

FIG. 9 shows a timing diagram 900 for a T/H circuit, according to some embodiments of the disclosure. The two clocks ϕ1a and ϕ2 can be intentionally overlapped on the rising edge (or falling edge) of ϕ1a and on the falling edge of ϕ2 to reset the summing node. In this embodiment, the rising edge of ϕ1a is used to avoid impacting the sampling edge (i.e., falling edge ϕ1a, when sampling switch opens to complete the sampling), which would have impacted the timing mismatch errors. Therefore, it is preferred to reset on the rising edge of ϕ1a instead of the falling edge of ϕ1a, as shown in FIG. 9.

The resetting of the summing node is represented by the factor $\alpha_{RST}$. With complete resetting, the memory is erased, and $\alpha_{RST}$ is equal to zero. With no resetting, the memory stays as is, and $\alpha_{RST}$ is equal to 1. Partial resetting can result in a value of $\alpha_{RST}$ between 0 and 1. It is desirable to reduce the memory by resetting (at least partially) the summing node. This can be done with minimal overhead as illustrated in FIG. 9 by overlapping the sampling clock ϕ1a and hold clock ϕ2. This overlap can reset the summing node and prevent the long accumulation of memory, which could be detrimental to the performance of the T/H circuit.

In the presence of chopping, partial resetting, and mismatches, the voltage $V_s$ at the input of the hold buffer (e.g., Buffer-2) can be given by:

$$V_s[n] = f_x(C_x/C_{t_x}(-V_{in}[n] + V_{dx}[n])) + \alpha_{RST1}\frac{V_s[n-1]C_{p_x}}{C_{t_x}} \quad (3)$$

$C_x$ is the sampling capacitance of the $x^{th}$ track, $C_{t_x}$ is the total capacitance of the $x^{th}$ track, $V_{dx}$ is the injected dither for the $x^{th}$ track, $\alpha_{RST1}$ is the portion of the previous sample's memory remaining after partial resetting, $C_{p_x}$ is the parasitic capacitance of the $x^{th}$ track, which also represents the memory term gain coefficient. The chopping function $f_x( )$ is ideally given by $f_x(V)|_{ideal} = (-1)^{PN} \cdot V$, where PN is a random number that can be 0 or 1. In practice, the chopping function can have gain, offset, and non-linear non-idealities.

If the order-dependent gain and offset are taken into account, the voltage at the input of the hold buffer (e.g., Buffer-2) is as follows:

$$V_s[n] = f_{xy}(-G_{xy}V_{in}[n] + G_{dxy}V_{dx}[n]) + \alpha_{RST1}\frac{V_s[n-1]C_{p_{xy}}}{C_{t_x}} + \text{Off}_{xy} \quad (4)$$

$f_{xy}( )$ is the state-dependent chopping function, which it depends on the present state (x) and previous state (y) of the chopper, $G_{xy}$ is the order-dependent gain (or attenuation) of the input, $G_{dxy}$ is the order-dependent gain of the dither, and $C_{p_{xy}}$ is the parasitic capacitance of the $x^{th}$ track, which can also depend on the previous track y, and $\text{Off}_{xy}$ is the order-dependent offset.

Using the least means square (LMS) algorithm and correlation (or counting) calibration scheme with the injected (additive) dither, it is possible to extract the gain correction coefficient $G_{dx}[n]$ (on the dither) of the hold-phase. That is:

$$G_{dx}[n+1] = G_{dx}[n] + \mu \cdot V_{dx}[n] \cdot (V_s[n] - G_{dx}[n] \cdot V_{dx}[n]) \quad (5)$$

The suffix x represents the present state (or track) in the circuit. In the above LMS equation (5), the voltage at the input of the hold buffer $V_s[n]$ with the estimated dither $G_{dx}[n] \cdot V_{dx}[n]$ removed is correlated with the dither $V_{dx}[n]$. μ is the step size for the LMS algorithm. The LMS algorithm converges to find the gain correction coefficient $G_{dx}[n]$ that minimizes the gain error of the hold-phase.

When performing calibration, binning is used to separate the samples based on their states. Binning means that the calibrations are computed separately for different bins, resulting in separate correction coefficients for correcting the order-dependent and/or state-dependent errors. When taking order-dependence (different tracks) into account, the binning of the samples can be based upon one or more of the following: present track (x), the previous track (y) of the sample [n−1], the second-previous track (z) of the sample [n−2], the future/following track [n+1], the second future/following track [n+2], and so on. This is illustrated in the following example:

$$G_{dxyz}[n+1] = G_{dxyz}[n] + \mu \cdot V_{dx}[n] \cdot (V_s[n] - G_{dxyz}[n] \cdot V_{dx}[n]) \quad (6)$$

$G_{dxyz}$ would be the gain correction coefficient that depends on the present, previous, and second-previous track. In the above LMS equation (6), the voltage at the input of the hold buffer $V_s[n]$ with the estimated dither $G_{dxyz}[n] \cdot V_{dx}[n]$ removed is correlated with the dither $V_{dx}[n]$. μ is the step size for the LMS algorithm. The LMS algorithm converges to find the gain correction coefficient $G_{dxyz}[n]$ that minimizes the gain error of the hold-phase.

To incorporate the chopping function and its state-dependent non-idealities, different gain coefficients can be determined and used depending on the chopper state. In other words, binning of samples and the updating of coefficients are performed based upon the state of the chopper. For chopper state PN=1, the LMS equation can be as follows:

$$G_{dxyz1}[n+1] = G_{dxyz1}[n] + \mu \cdot V_{dx}[n] \cdot PN \cdot (V_s[n] - G_{dxyz1}[n] \cdot PN \cdot V_{dx}[n]) \quad (7a)$$

$G_{dxyz1}$ would be the gain correction coefficient that depends on the present, previous, and second-previous track, when the chopper state PN=1. In the above LMS equation (7a), the voltage at the input of the hold buffer $V_s[n]$ with the estimated dither $G_{dxyz1}[n] \cdot PN \cdot V_{dx}[n]$ removed is correlated with the dither $V_{dx}[n]$ and the state of the chopper PN. μ is the step size for the LMS algorithm. The LMS algorithm converges to find the gain correction coefficient $G_{dxyz1}[n]$ that minimizes the gain error of the hold-phase. Note that when chopper state PN=0, the above LMS algorithm does not update because $V_{dx}[n] \cdot PN \cdot (V_s[n] - G_{dxyz1}[n] \cdot PN \cdot V_{dx}[n]) = 0$, when PN=0. Effectively, only samples associated with chopper state PN=1 are used and binned for updating $G_{dxyz1}$.

For chopper state PN=0, the LMS equation can be as follows:

$$G_{dxyz0}[n+1] = G_{dxyz0}[n] + \mu \cdot V_{dx}[n] \cdot PN' \cdot (V_s[n] - G_{dxyz0}[n] \cdot PN' \cdot V_{dx}[n]) \quad (8a)$$

$G_{dxyz0}$ would be the gain correction coefficient that depends on the present, previous, and second-previous track, when the chopper state PN=0. In the above LMS equation (8a), the voltage at the input of the hold buffer $V_s[n]$ with the estimated dither $G_{dxyz0}[n] \cdot PN' \cdot V_{dx}[n]$ removed is correlated with the dither $V_{dx}[n]$ and the inverse state of the chopper PN'. $\mu$ is the step size for the LMS algorithm. The LMS algorithm converges to find the gain correction coefficient $G_{dxyz0}[n]$ that minimizes the gain error of the hold-phase. Note that when chopper state PN'=0, the above LMS algorithm does not update because $V_{dx}[n] \cdot PN' \cdot (V_s[n] - G_{dxyz0}[n] \cdot PN' \cdot V_{dx}[n]) = 0$, when PN'=0. Effectively, only samples associated with chopper state PN'=1 are used and binned for updating $G_{dxyz0}$.

Gain correction coefficient $G_{dxyz}$ of the dither is ideally equal to gain correction coefficient $G_{xy}$ of the input signal. However, there may be some scaling needed due to systematic mismatch between the two paths, which can be adjusted once. That is:

$$G_{xyz} = \alpha G_{dxyz} \quad (9)$$

$\alpha$ is a fixed scaling coefficient for adjusting the ratio between the gain correction coefficient of the dither and the gain correction coefficient of the input signal. The scaling between the gain correction coefficient of the dither $G_{dxyz}$ and the gain correction coefficient of the input signal $G_{xyz}$ can also be accounted for when extracting for gain errors in the hold-phase (and in the track-phase as well).

Alternatively, the chopping gain can be determined by other chopping-dependent estimation equations (e.g., alternatives to equations (7a) and (8a)). For chopper state PN=1, the alternative LMS equation can be as follows:

$$G_{dxyz1}[n+1] = G_{dxyz1}[n] + \mu \cdot V_{dx}[n] \cdot (-1)^{PN} \cdot (V_s[n] - G_{dxyz1}[n] \cdot (-1)^{PN} \cdot V_{dx}[n]) \quad (7b)$$

In the above LMS equation (7b), the voltage at the input of the hold buffer $V_s[n]$ with the estimated dither $G_{dxyz1}[n] \cdot (-1)^{PN} \cdot V_{dx}[n]$ removed is correlated with the dither $V_{dx}[n]$ and the multiplicative dither value of the chopper $(-1)^{PN}$. $\mu$ is the step size for the LMS algorithm. $V_{dx}[n] \cdot (-1)^{PN}$ or $(-1)^{PN} \cdot V_{dx}[n]$ can represent a chopped dither. The LMS algorithm converges to find the gain correction coefficient $G_{dxyz1}[n]$ that minimizes the gain error of the hold-phase.

For chopper state PN=0, the alternative LMS equation can be as follows:

$$G_{dxyz0}[n+1] = G_{dxyz0}[n] + \mu \cdot V_{dx}[n] \cdot (-1)^{PN'} \cdot (V_s[n] - G_{dxyz0}[n] \cdot (-1)^{PN'} \cdot V_{dx}[n]) \quad (8b)$$

In the above LMS equation (8b), the voltage at the input of the hold buffer $V_s[n]$ with the estimated dither $G_{dxyz0}[n] \cdot (-1)^{PN'} \cdot V_{dx}[n]$ removed is correlated with the dither $V_{dx}[n]$ and the multiplicative dither value of the chopper $(-1)^{PN'}$. $\mu$ is the step size for the LMS algorithm. $V_{dx}[n] \cdot (-1)^{PN}$ or $(-1)^{PN} \cdot V_{dx}[n]$ can represent a chopped dither. The LMS algorithm converges to find the gain correction coefficient $G_{dxyz0}[n]$ that minimizes the gain error of the hold-phase.

In some cases, histograms or counting can be used in LMS equations to lower the power consumption of the calibration. The LMS equation based on counting can be as follows:

$$G_{dxyz}[n+1] = G_{dxyz}[n] + \mu \cdot \text{sign}(V_{dx}[n]) \cdot \text{sign}(V_s[n] - G_{dxyz}[n] \cdot V_{dx}[n]) \quad (10)$$

In the above LMS equation (10), the sign (denoted as the sign function sign( )) of voltage at the input of the hold buffer $V_s[n]$ with the estimated dither $G_{dxyz}[n] \cdot V_{dx}[n]$ removed is multiplied with the sign of the dither $V_{dx}[n]$. $\mu$ is the step size for the LMS algorithm. The LMS algorithm converges to find the gain correction coefficient $G_{dxyz}[n]$ that minimizes the gain error of the hold-phase. Using the sign of these values results in +1's or −1's which can be easily counted or accumulated digitally.

It is possible to also take the chopper state into account for binning and determining of gain coefficients. For chopper state PN=1, the LMS equation can be as follows:

$$G_{dxyz1}[n+1] = G_{dxyz1}[n] + \mu \cdot \text{sign}(V_{dx}[n]) \cdot PN \cdot \text{sign}(V_s[n] - G_{dxyz1}[n] \cdot PN \cdot V_{dx}[n]) \quad (11)$$

$G_{dxyz1}$ would be the gain correction coefficient that depends on the present, previous, and second-previous track, when the chopper state PN=1. In the above LMS equation (11), the sign of the voltage at the input of the hold buffer $V_s[n]$ with the estimated dither $G_{dxyz1}[n] \cdot PN \cdot V_{dx}[n]$ removed is multiplied with the sign of dither $V_{dx}[n]$ and with the state of the chopper PN. $\mu$ is the step size for the LMS algorithm. The LMS algorithm converges to find the gain correction coefficient $G_{dxyz1}[n]$ that minimizes the gain error of the hold-phase. Note that when chopper state PN=0, the above LMS algorithm does not update because $\text{sign}(V_{dx}[n]) \cdot PN \cdot \text{sign}(V_s[n] - G_{dxyz1}[n] \cdot PN \cdot V_{dx}[n]) = 0$, when PN=0. Effectively, only samples associated with chopper state PN=1 are used and binned for updating $G_{dxyz1}$.

For chopper state PN=0 (PN'=1), the LMS equation can be as follows:

$$G_{dxyz0}[n+1] = G_{dxyz0}[n] + \mu \cdot \text{sign}(V_{dx}[n]) \cdot PN' \cdot \text{sign}(V_s[n] - G_{dxyz0}[n] \cdot PN' \cdot V_{dx}[n]) \quad (12)$$

$G_{dxyz0}$ would be the gain correction coefficient that depends on the present, previous, and second-previous track, when the chopper state PN=0. In the above LMS equation (12), the voltage at the input of the hold buffer $V_s[n]$ with the estimated dither $G_{dxyz0}[n] \cdot PN' \cdot V_{dx}[n]$ removed is multiplied with the sign of dither $V_{dx}[n]$ and with the inverse state of the chopper PN'. $\mu$ is the step size for the LMS algorithm. The LMS algorithm converges to find the gain correction coefficient $G_{dxyz0}[n]$ that minimizes the gain error of the hold-phase. Note that when chopper state PN'=0, the above LMS algorithm does not update because $\text{sign}(V_{dx}[n]) \cdot PN' \cdot \text{sign}(V_s[n] - G_{dxyz0}[n] \cdot PN' \cdot V_{dx}[n]) = 0$, when PN'=0. Effectively, only samples associated with chopper state PN'=1 are used and binned for updating $G_{dxyz0}$.

Regarding the memory term $\alpha_{RST1}$, LMS correlation can be performed with the previous sample to give:

$$\alpha_{xyz}[n+1] = \alpha_{xyz}[n] + \mu \cdot V_{dx}[n-1] \cdot (V_s[n] - \alpha_{xyz}[n] \cdot V_s[n-1]) \quad (13a)$$

$\alpha_{xyz}$ would be the memory correction coefficient that depends on the present, previous, and/or future tracks. Moreover, $\alpha_{xyz}$ represents the memory term $$\alpha_{RST1}\left(\frac{C_{p_{xy}}}{C_{t_x}}\right)$$

in equations (3) and (4). In the above LMS equation (6), the voltage at the input of the hold buffer $V_s[n]$ with the estimated memory contribution from the previous sample $\alpha_{xyz}[n] \cdot V_s[n-1]$ removed is correlated with the previous dither $V_{dx}[n-1]$. $\mu$ is the step size for the LMS algorithm. The LMS algorithm converges to find the memory correction coefficient $\alpha_{xyz}[n]$ that minimizes the memory error of the hold-phase.

Alternatively, LMS equation based on histogram/counting can be performed with the previous sample to give:

$$\alpha_{xyz}[n+1] = \alpha_{xyz}[n] + \mu \cdot \text{sign}(V_{dx}[n-1]) \cdot \text{sign}(V_s[n] - \alpha_{xyz}[n] \cdot V_s[n-1]) \quad (14a)$$

In the above LMS equation (14a), the sign of voltage at the input of the hold buffer $V_s[n]$ with the estimated memory contribution from the previous sample $\alpha_{xyz}[n] \cdot V_s[n-1]$ removed is multiplied with the sign of the previous dither $V_{dx}[n-1]$. $\mu$ is the step size for the LMS algorithm. The LMS algorithm converges to find the memory correction coefficient $\alpha_{xyz}[n]$ that minimizes the memory error of the hold-phase.

In the presence of chopping, equations (13a) and (14a) can be modified as follows:

$$\alpha_{xyz}[n+1] = \alpha_{xyz}[n] + \mu \cdot (-1)^{PN[n-1]} \cdot V_{dx}[n-1] \cdot (V_s[n] - \alpha_{xyz}[n] \cdot V_s[n-1]) \quad (13b)$$

In the above LMS equation (13b), the voltage at the input of the hold buffer $V_s[n]$ with the estimated memory contribution from the previous sample $\alpha_{xyz}[n] \cdot V_s[n-1]$ removed is multiplied with the previous dither $V_{dx}[n-1]$ and with the previous multiplicative dither value of the chopper $(-1)^{PN[n-1]}$. $\mu$ is the step size for the LMS algorithm. The LMS algorithm converges to find the memory correction coefficient $\alpha_{xyz}[n]$ that minimizes the memory error of the hold-phase.

Alternatively, LMS equation based on histogram/counting can be performed with the previous sample to give:

$$\alpha_{xyz}[n+1] = \alpha_{xyz}[n] + \mu \cdot (-1)^{PN[n-1]} \cdot \text{sign}(V_{dx}[n-1]) \cdot \text{sign}(V_s[n] - \alpha_{xyz}[n] \cdot V_s[n-1]) \quad (14b)$$

In the above LMS equation (14b), the sign of voltage at the input of the hold buffer $V_s[n]$ with the estimated memory contribution from the previous sample $\alpha_{xyz}[n] \cdot V_s[n-1]$ removed is multiplied with the sign of the previous dither $V_{dx}[n-1]$ and with the previous multiplicative dither value of the chopper $(-1)^{PN[n-1]}$. $\mu$ is the step size for the LMS algorithm. The LMS algorithm converges to find the memory correction coefficient $\alpha_{xyz}[n]$ that minimizes the memory error of the hold-phase.

By dividing the samples into different bins to account for present track, previous track(s), future track(s), chopper states, etc., different gain and memory coefficients can be obtained that account for the order-dependent and state-dependent effects in the T/H circuit.

When the hold buffer (or amplifier) is shared among the tracks, the hold-phase memory represents a global memory that is shared across all the tracks (interleaved slices). Therefore, the previous memory term is [n−1]. However, if the different tracks/slices are separate (the hold buffer is not shared), the memory terms can represent the previous sample of that particular track/slice, which may have happened kth sample in the past (i.e., [n−k]). Moreover, the memory terms can be a combination of both terms. That is:

$$V_s[n] = f_{xyz}(-G_{xyz}V_{in}[n] + G_{dxyz}V_{dx}[n]) + \quad (15)$$
$$\alpha_{RST1}\frac{V_s[n-1]C_{p_{xyz}}}{C_{t_x}} + \alpha_{RSTk}\frac{V_s[n-k]C_{p_{xk}}}{C_{t_x}} + \text{Off}_{xyz} + \text{Off}_{xkz}$$

Finally, the offset can be estimated in an order-dependent manner, such that:

$$V_{\text{off}_{xyz}}[n+1] = V_{\text{off}_{xyz}}[n] + \mu \cdot (V_{s_{\text{mem-corr}}}[n] \cdot V_{\text{off}_{xyz}}[n]) \quad (16)$$

$V_{s_{\text{mem-corr}}}$ is $V_s$ after applying the memory correction. That is:

$$V_{s_{\text{mem\_corr}}}[n] = V_s[n] - \alpha_{xyz}V_s[n-1] \quad (17)$$

In the LMS equation (16), the voltage at the input of the hold buffer after applying the memory correction $V_{s_{\text{mem\_corr}}}[n]$ with the estimated offset $V_{\text{off}_{xyz}}[n]$ removed is used to update the offset correction coefficient $V_{\text{off}_{xyz}}[n]$. $\mu$ is the step size for the LMS algorithm. The LMS algorithm converges to find the offset correction coefficient $V_{\text{off}_{xyz}}[n]$ that minimizes the offset error of the hold-phase.

The calibrated output can be given by:

$$V_{in_{corr}}[n] = \quad (18a)$$
$$-\frac{1}{G_{xyz}}\left[f_{xyz}^{-1}(V_s[n] - \alpha_{xyz}V_s[n-1] - V_{\text{off}_{xyz}}[n]) - G_{dxyz}V_{dx}[n]\right]$$

In some cases, the gain correction can be performed before unchopping (reversing the random chopper), to be combined with the chopper state-dependent gain mentioned above, which changes equation (18a) to be:

$$V_{in_{corr}}[n] = -\frac{1}{G_{xyz}} \quad (18b)$$
$$\left[f_{xyz}^{-1}(V_s[n] - \alpha_{xyz}V_s[n-1] - V_{\text{off}_{xyz}}[n] - (-1)^{PN[n]} \cdot G_{dxyz}V_{dx}[n])\right]$$

The coefficients computed based on the LMS equations herein can be applied to the voltage at the input of the hold buffer in a suitable manner to remove the injected dither and obtain a corrected signal. The correction can be applied in the digital domain after the voltage at the input of the hold buffer is digitized by a converter.

Therefore, the order-dependent, state-dependent, gain, offset, and memory in the hold-phase can be calibrated. Through binning, the calibration takes into account, e.g., the present track/slice, the present chopper state, the previous/past track, and the previous/past chopper state.

Besides gain, offset, and memory errors, the hold-phase has non-linearities which can cause second, third, or higher order harmonics. The previous discussion for gain calibration calibrates the linear gain error only. The non-linearities can come from the output switch in a time-interleaved sampling network. The non-linearities can come from Buffer-2 following the time-interleaved sampling network. The injected (additive) dither in the time-interleaved sampling network can expose the non-linearities. The injected dither can have different values. Binning can be used to extract sets of non-linearity correction coefficients that can account for order-dependence and chopper state-dependence. Through binning, the calibration can into account, e.g., the present track/slice, the present chopper state, the previous/past track, and the previous/past chopper state.

Non-linearities in the hold-phase can be extracted in a variety of ways. The following describes some examples of how the non-linearities can be extracted using the injected (additive) dither and binning.

First, the samples are divided into different bins to account for, e.g., present track, previous track(s), future track(s), chopper states, etc. The binned samples are then used to extract different sets of non-linearity correction coefficients that account for the order-dependent and state-dependent effects in the T/H circuit. To extract the different sets of non-linearity correction coefficients, a counting scheme can be used. Specifically, the counting scheme defines ranges set by inspection points, and counts binned samples with the injected dither removed falling within the different ranges separately for different values of the dither. Inspection points are selected in a way to expose specific kinds of non-linearities. Partial errors can be formed by comparing counts associated with different values of the dither. For example, a partial error defined at a given inspection point compares (1) a count of the binned samples falling within a range defined by the given inspection point when the dither has a first value, and (2) a count of the binned samples falling within the range defined by the given inspection point when the dither has a second value. Multiple partial errors are formed at different inspection points. Then, the partial errors are combined in a way to form an error that exposes a certain kind of non-linearity, such as even or odd symmetry of the non-linearity. For example, a partial error at a positive inspection point can be summed with a partial error at a negative inspection point to expose even symmetry associated with even-order non-linearity. In another example, a partial error at a positive inspection point can be subtracted by a partial error at a negative inspection point to expose odd symmetry associated with odd-order non-linearity. An LMS equation can be defined based on the error, to update a correction coefficient that can correct the particular kind of non-linearity. To account for order-dependence and state-dependence, the correction coefficient updated by the LMS equation corresponding to a particular order and/or chopper state is used to digitally correct only samples that corresponds to the particular order and/or chopper state. The LMS equation can drive the correction coefficient smaller and smaller over time to calibrate out the non-linearity corresponding to the particular order and/or chopper state. In some cases, the LMS equation can be defined by an error computed/accumulated over a block of binned samples. In some cases, the LMS equation can be defined by an error computed on a sample-by-sample basis. Sample-by-sample counting incrementally updates an error coefficient using values such as +1 or −1 to represent an incremental difference/comparison being made between two different dither values.

System for Calibrating Hold-Phase Errors

Figure 10:
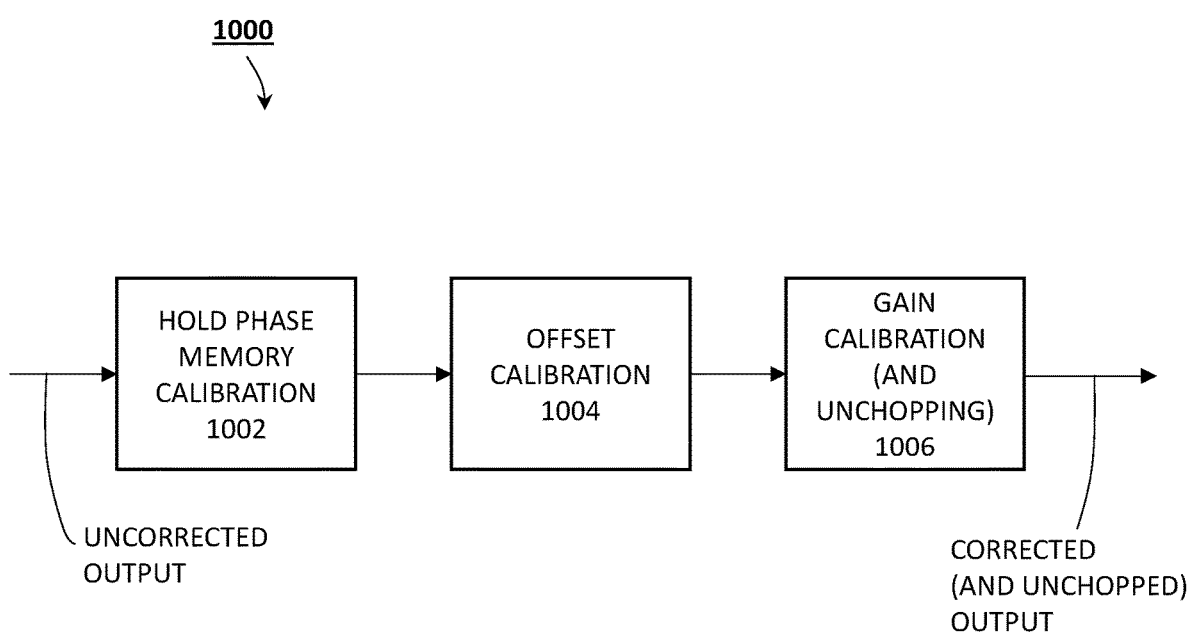
FIG. 10 illustrates calibration of hold-phase memory calibration, offset calibration, and gain calibration (with unchopping), according to some embodiments of the disclosure.

FIG. 10 illustrates a system 1000 including calibration of hold-phase memory calibration, offset calibration, and gain calibration (with unchopping), according to some embodiments of the disclosure. In 1002, hold-phase memory error can be calibrated. In 1004, hold-phase offset can be calibrated. In 1006, hold-phase gain can be calibrated, optionally integrated with unchopping to obtain the corrected (and unchopped) output. For instance, the LMS equations described herein can be used in 1002, 1004, and 1006 to address these hold-phase non-idealities. In some cases, 1006 can implement hold-phase non-linearity calibration. Binning is used to address order-dependent and state-dependent non-idealities in the hold-phase. The calibrations in 1002, 1004, and 1006 may use the dither injected in the hold-phase for correlation- or histogram-based calibrations.

The memory correction employed using the $\alpha_{xyz}$ term in equation (18) is an infinite impulse response (IIR) filter that can fix the cumulative effect of an infinite number of memory samples. Moreover, the offset correction affects the offset because $V_s$ includes an offset term. If the memory correction is done before the offset correction, then the memory correction can correct for the effect of the older offset terms, and the offset correction corrects for the remaining order-dependent offset. This order-dependence may be accentuated by the memory correction itself. On the other hand, if the offset correction is done before the memory correction, then some older offset terms will not be accounted for, which could be acceptable if small enough, and the offset order-dependence may be less severe. For best accuracy, the offset calibration 1004 is preferably done after the hold-phase memory calibration 1002 as shown in FIG. 10. However, for small memory errors, where memory terms older than n−1 are negligible, it may be more efficient to do the offset calibration 1004 before the hold-phase memory calibration 1002.

Another consideration is that the offset correction may be applied right before unchopping to ensure no residual offset that may degrade the noise. If chopping is not employed, then the offset correction of the hold-phase can be combined with the offset correction of the track-/sampling-phase.

Figure 11:
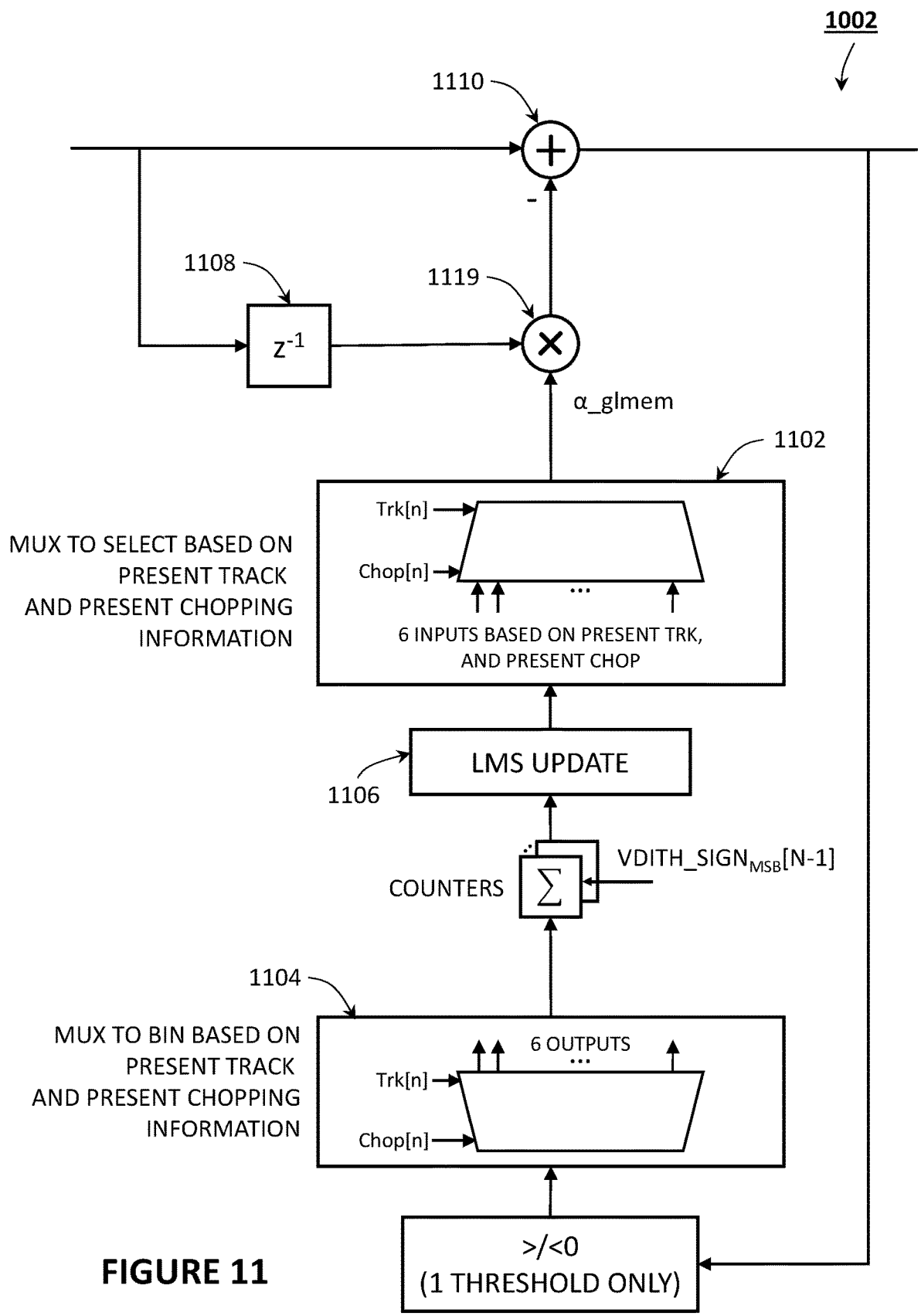
FIG. 11 illustrates an exemplary implementation for hold-phase memory calibration, according to some embodiments of the disclosure.
Figure 12:
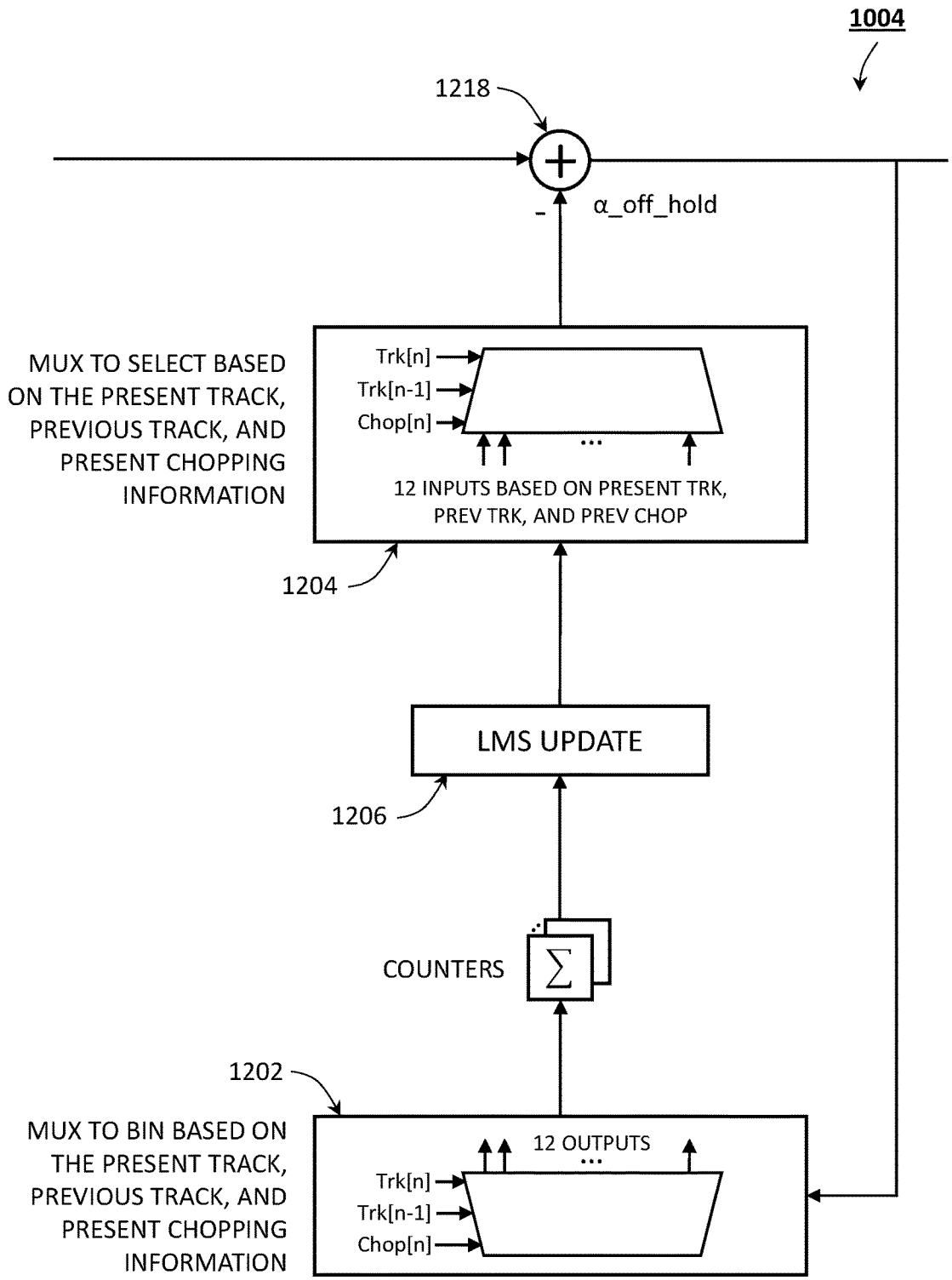
FIG. 12 illustrates an exemplary implementation for offset calibration, according to some embodiments of the disclosure.
Figure 13:
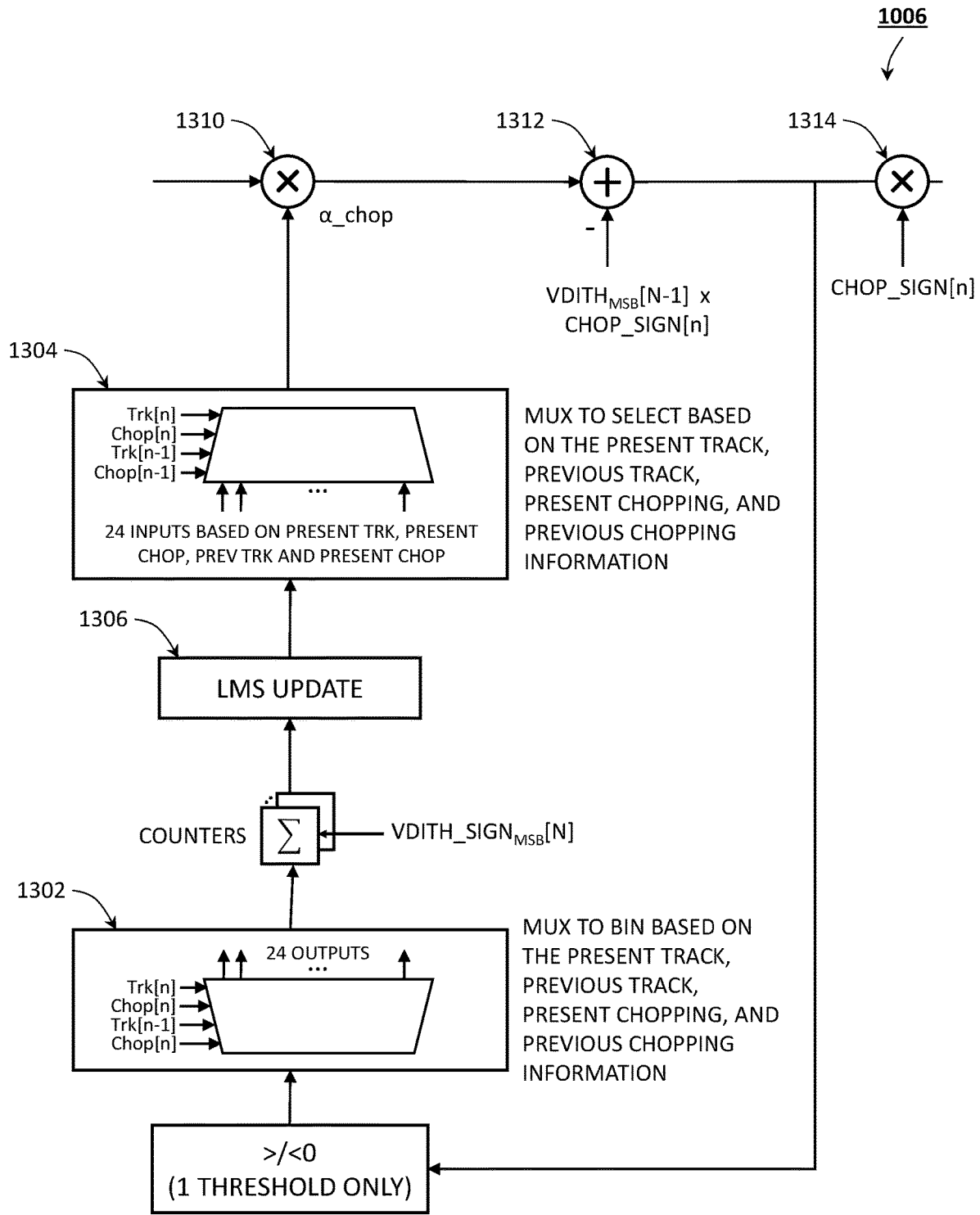
FIG. 13 illustrates an exemplary implementation for gain calibration (with unchopping), according to some embodiments of the disclosure.

FIGS. 11-13 show an exemplary implementation for hold-phase non-idealities calibration in a 3-way randomly interleaved T/H circuit with dither injection and chopping. A histogram/counting based scheme is used.

FIG. 11 illustrates an exemplary implementation for hold-phase memory calibration 1002, according to some embodiments of the disclosure. Hold-phase memory calibration 1002 includes multiplexer (mux) 1102 to perform binning as described herein. Mux 1102 bins samples based on which time-interleaved sampling network is the present track Trk[n], and which present state the chopper is in Chop[n]. In this example, the present track Trk[n] state has 3 possibilities, since the T/H circuit is a 3-way randomly interleaved T/H circuit with 3 time-interleaved sampling networks. The present chopper state Chop[n] has 2 possibilities, where PN=0 or PN=1. As a result, there are a total of 6 combinations of present track Trk[n] and present chopper state Chop[n]. Thus, 6 bins are used to bin the samples, where each bin has samples corresponding to one of the 6 combinations of present track Trk[n] and present chopper state Chop[n].

Hold-phase memory calibration 1002 also includes LMS update 1106, which represents a block for implementing the LMS equations described herein for memory calibration (e.g., implemented in digital circuitry and/or processor, such as an on-chip microprocessor). The different bins of samples from mux 1104 serve to update different memory correction coefficients respectively. There are 6 memory correction coefficients, each corresponding to one of the 6 combinations of present track Trk[n] and present chopper state Chop[n].

Mux 1102 performs selection to select the memory correction coefficient for correcting a sample, based on the present track Trk[n] and present chopper state Chop[n]. A selected memory correction coefficient (output from mux 1102) can be the memory correction coefficient (shown as $\alpha\_glem$) that can be used for correcting a given sample.

The uncorrected output $V_s[n]$ is delayed by delay block 1108 to form $V_s[n-1]$. Multiplier 1119 multiplies the result from delay block 1108 ($V_s[n-1]$) with the selected memory correction coefficient (α_glem) to form an estimated memory contribution. The summation node 1110 can subtract the uncorrected output $V_s[n]$ by the estimated memory contribution to remove the memory error, to form a memory-corrected output.

FIG. 12 illustrates an exemplary implementation for offset calibration 1004, according to some embodiments of the disclosure. Offset calibration 1004 includes mux 1202 to perform binning as described herein. Mux 1202 bins samples based on which time-interleaved sampling network is the present track Trk[n], which time-interleaved sampling network was the previous track Trk[n−1], and which previous state the chopper was in Chop[n−1]. In this example, the present track state Trk[n] has 3 possibilities, since the T/H circuit is a 3-way randomly interleaved T/H circuit with 3 time-interleaved sampling networks. The previous track state Trk[n−1] has 2 possibilities per each present track state Trk[n] (the same time-interleaved sampling network is not used twice consecutively/successively). The previous chopper state Chop[n−1] has 2 possibilities, where PN=0 or PN=1. As a result, there are a total of 12 combinations of present track Trk[n], previous track Trk[n−1], and previous chopper state Chop[n−1]. Thus, 12 bins are used to bin the samples, where each bin has samples corresponding to one of the 12 combinations of present track Trk[n], previous track Trk[n−1], and previous chopper state Chop[n−1].

Offset calibration 1004 also includes LMS update 1206, which represents implementing the LMS equations described herein for offset calibration (e.g., implemented in digital circuitry and/or processor, such as an on-chip microprocessor). The different bins of samples from mux 1202 serve to update different offset correction coefficients respectively. There are 12 offset correction coefficients, each corresponding to one of the 12 combinations of present track Trk[n], previous track Trk[n−1], and previous chopper state Chop[n−1].

Mux 1204 performs selection to select the offset correction coefficient for correcting a sample, based on present track Trk[n], previous track Trk[n−1], and previous chopper state Chop[n−1]. A selected offset correction coefficient (output from mux 1204) can be the (estimated) offset correction coefficient (shown as α_off_hold) that can be used for correcting a given sample.

The summation node 1218 can subtract the result from the previous calibration (e.g., the memory-corrected output from hold-phase memory calibration 1002) by the selected (estimated) offset correction coefficient (α_off_hold) to remove the offset error, to form a memory-and-offset-corrected output.

FIG. 13 illustrates an exemplary implementation for gain calibration (with unchopping) 1006, according to some embodiments of the disclosure. Gain calibration (with unchopping) 1006 includes mux 1302 to perform binning as described herein. Mux 1302 bins samples based on which time-interleaved sampling network is the present track Trk[n], which time-interleaved sampling network was the previous track Trk[n−1], which present state the chopper is in Chop[n], and which previous state the chopper was in Chop[n−1]. In this example, the present track state Trk[n] has 3 possibilities, since the T/H circuit is a 3-way randomly interleaved T/H circuit with 3 time-interleaved sampling networks. The previous track state Trk[n−1] has 2 possibilities per each present track state Trk[n] (the same time-interleaved sampling network is not used twice consecutively/successively). The present chopper state Chop[n] has 2 possibilities, where PN=0 or PN=1. The previous chopper state Chop[n−1] has 2 possibilities, where PN=0 or PN=1.

As a result, there are a total of 24 combinations of present track Trk[n], previous track Trk[n−1], present chopper state Chop[n], and previous chopper state Chop[n−1]. Thus, 24 bins are used to bin the samples, where each bin has samples corresponding to one of the 24 combinations of present track Trk[n], previous track Trk[n−1], present chopper state Chop[n], and previous chopper state Chop[n−1].

Gain calibration (with unchopping) 1006 also includes LMS update 1306, which represents implementing the LMS equations described herein for gain calibration (e.g., implemented in digital circuitry and/or processor, such as an on-chip microprocessor). The different bins of samples from mux 1302 serve to update different gain correction coefficients respectively. Accordingly, there are 24 gain correction coefficients, each corresponding to one of the 24 combinations of present track Trk[n], previous track Trk[n−1], present chopper state Chop[n], and previous chopper state Chop[n−1].

Mux 1304 performs selection to select the gain correction coefficient for correcting a sample based on the present track Trk[n], previous track Trk[n−1], present chopper state Chop[n], and previous chopper state Chop[n−1]. A selected gain correction coefficient (output from mux 1304) can be the (estimated) gain correction coefficient (shown as α_chop) that can be used for correcting a given sample.

Multiplier 1310 can multiply the result from the previous calibration (e.g., memory-and-offset-corrected output of offset calibration 1004) by the selected (estimated) gain correction coefficient (α_chop) to remove the gain error.

Summation node 1312 can subtract the result from multiplier 1310 by a chopped dither (shown as $VDITH_{MSB}[N] \times CHOP\_SIGN[n]$) to remove the injected additive dither. Multiplier can multiply the result from the summation node 1312 by the state of the chopper (shown as CHOP_SIGN[n]) to unchop the signal (i.e., remove the injected multiplicative dither). The result is a corrected-and-unchopped output.

Suitable circuitry can be provided to extract error coefficients and calibrate for order-dependent, state-dependent hold-phase non-linearities, and the circuitry can be implemented in 1006. Hold-phase non-linearities calibrations can occur after hold-phase memory calibration 1002 and offset calibration 1004.

To implement hold-phase non-linearities calibration, one or more multiplexers can implement binning of samples so that different sets of non-linearity correction coefficients can be determined based on different combinations of one or more of: present track Trk[n], previous track Trk[n−1], present chopper state Chop[n], and previous chopper state Chop[n−1]. Digital hardware, such as: counters, logic to determine whether a given binned sample (with the dither removed) is within a given range defined by an inspection point, and LMS update block, can be implemented. One or more multiplexers can implement selecting a corresponding set of non-linearity correction coefficients for correcting a given sample. Digital hardware can be implemented to digitally correct the output based on the selected set of non-linearity correction coefficients.

Address Track-Phase Errors

Ideally, the sampling network is reset when switching from the hold-phase to the next track-/sampling-phase. This resetting can be done in an extra phase, but that additional phase will require an additional track/network to process the input during the resetting phase. For instance, instead of two networks for ping-ponged operation, three networks would be included to accommodate the additional resetting phase. Instead of three networks for randomized ping-ponged operation, four networks would be included to accommodate the additional resetting phase. This will require additional power and area to drive, clock, and calibrate the additional network. It is also possible to reset the network in a portion of the hold or track phases, but this would reduce the acquisition or hold times, and can increase the power consumption and/or degrade performance.

Alternatively, resetting the sampling network can be avoided by relying on calibration to fix any residual memory and kick-back errors. Since the sampling network is not reset from the hold-phase to the next track/sample phase, residual charge can exist on the sampling capacitance when the sampling starts. Ideally, the acquisition time would be long enough for this residual charge to dissipate as part of the settling process. If the settling is not complete, this memory charge causes kick-back and memory that can shape the frequency response of the T/H or amplifier circuit. In addition, if randomization is employed, the "previous" charge for each track may be a random sample in time, which results in degradation in the noise. It is desirable to have these errors calibrated to relax the design on the analog side, reduce the power consumption, and improve the performance.

The representation of the memory/kick-back error in the track-phase can be given by the following:

$$V_{incap}[n] = V_{in}[n] - \alpha_m(\alpha_{RSTk} V_s[n-k]) \quad (19)$$

$V_{incap}$ is the sampled voltage at the end of the sampling/track-phase, $V_{in}$ is the input voltage, $V_s$ is the held voltage at the end of the last phase this track was used, which happens to be the $k^{th}$ past sample, $\alpha_{RSTk}$ is the resetting coefficient of the kth past sample, and $\alpha_m$ is the track-phase memory coefficient. $\alpha_{RSTk}$ appears explicitly in equation (19), as opposed to being part of the memory coefficient $\alpha_{xyz}$ as was the case in the hold-phase memory in equations (3) and (4), in which it was multiplied by the capacitor ratio.

Since the T/H interleaves multiple tracks, the last sample memory on any particular track is not necessarily the last sample (n−1), but can be any arbitrary past sample (n−k). In addition, since randomization is employed, k is variable. However, for every sample on every track, the value of k, the (n−k)$^{th}$ sample and dither are known. Therefore, it is possible use this information to calibrate the errors as explained below.

In the presence of hold-phase dither, equation (19) becomes:

$$V_{incap}[n] = V_{in}[n] - \alpha_m(\alpha_{RSTk} V_s[n-k] - V_d[n-k]) \quad (20)$$

$V_d[n-k]$ is the additive dither injected in the hold-phase of the last sample in which this track/network was used. This dither can be used to calibrate the track-phase memory as follows:

$$\alpha_m[n+1] = \alpha_m[n] + \mu \cdot V_d[n-k](V_s[n] - \alpha_m[n] \cdot V_s[n-k]) \quad (21)$$

$\alpha_m$ would be the track-phase memory correction coefficient. In the above LMS equation (21), the held voltage $V_s[n]$ with the estimated memory contribution $\alpha_m[n] \cdot V_s[n-k]$ removed is correlated with the $k^{th}$ past dither $V_d[n-k]$. $\mu$ is the step size for the LMS algorithm. The LMS algorithm converges to find the track-phase memory correction coefficient $\alpha_m[n]$ that minimizes the memory error of the track-phase.

Correcting for the track-phase memory involves storing the last sample from each track to be used by the memory calibration algorithm. Using histograms/counters instead of correlators, the alternative LMS equation is as follows:

$$\alpha_m[n+1] = \alpha_m[n] + \mu \cdot \text{sign}(V_d[n-k]) \cdot \text{sign}(V_s[n] - \alpha_m[n] \cdot V_s[n-k]) \quad (22)$$

In the above LMS equation (22) the sign of held voltage $V_s[n]$ with the estimated track-phase memory contribution $\alpha_m[n] \cdot V_s[n-k]$ removed is multiplied with the sign of the $k^{th}$ past dither $V_d[n-k]$. $\mu$ is the step size for the LMS algorithm. The LMS algorithm converges to find the track-phase memory correction coefficient $\alpha_m[n]$ that minimizes the memory error of the track-phase.

Alternatively, the old memory can be reset for tracks that remain idle during the randomization process. That is, instead of resetting every track, which necessitates adding an additional track as mentioned before, it is possible to reset the track that remains idle for more than one phase. In this embodiment, the memory coefficient would be equal to zero if k>2. This can simplify the calibration at the expense of analog complexity that is required to check for an idle track and reset "stale" memory. k=1 is not allowed, because the same track cannot be used for two successive samples. Also, k=2 cannot be reset easily, because it would conflict with it being ready for the next sample. Therefore, the earliest "stale" sample that can be easily reset without timing overhead is for k=3.

From equation (20), if partial resetting is employed, then the memory coefficient for $V_s$ is different from $V_d$. This indicates that the track-phase memory correction coefficient used to subtract the dither $V_d(\alpha_m)$ would be different from that used to subtract $V_s(\alpha_{ms})$. That is:

$$V_{incap\_corr}[n] = V_{incap}[n] + \alpha_{ms} V_s[n-k] - \alpha_m V_d[n-k] \quad (23)$$

The relationship/ratio between the memory coefficients $\alpha_{ms}$ and $\alpha_m$ is based on the parameter $\alpha_{RSTk}$:

$$\alpha_{ms} = \alpha_m \cdot \alpha_{RSTk} \quad (24)$$

$\alpha_{RST}$ was part of the memory coefficient in the hold-phase that was captured by the parameter $\alpha_{xyz}$ in equations (13) and (14). However, in the track-phase, $\alpha_{RSTk}$ appears explicitly in equations (19) to (24) above. This may require a different way of dealing with $\alpha_{RST}$ in the track-phase memory to extract its value, which is being described herein.

In some embodiments, the corrections of the errors in both the track-and-hold phases can be combined as follows (computed coefficients from the LMS algorithms can be applied to the signal to correct for the non-idealities):

$$V_{outh_{corr}}[n] = \quad (25)$$
$$-\left[\frac{1}{G_{xy}} f_x^{-1}\left(V_s[n] - \alpha_{xy} V_s[n-1] - V_{off_{xy}}[n]\right) - G_{dxy} V_{dx}[n] - \right.$$
$$\left. \alpha_{ms_{xy}}(-1)^{PN[n-k]} V_s[n-k] + \alpha_{m_{xy}} V_{dx}[n-k]\right]$$

If the gain correction is done before unchopping, equation (25) becomes:

$$V_{outh_{corr}}[n] = -\left[\frac{1}{G_{xy}} f_x^{-1} \right. \quad (26)$$
$$\left(V_s[n] - \alpha_{xy} V_s[n-1] - V_{off_{xy}}[n] - (-1)^{PN[n]} \cdot G_{dxy} V_{dx}[n]\right) -$$
$$\left. \alpha_{ms_{xy}}(-1)^{PN[n-k]} V_s[n-k] + \alpha_{m_{xy}} V_{dx}[n-k]\right]$$

In the equation (26) above, the first two terms are the hold-phase gain, offset and memory (e.g., $\frac{1}{G_{xy}} f_x^{-1}(V_s[n] - \alpha_{xy} V_s[n-1] - V_{\mathit{off}_{xy}}[n] - (-1)^{PN[n]} \cdot G_{dxy} V_{dx}[n])$, while the last two terms (e.g., $\alpha_{ms_{xy}}(-1)^{PN[n-k]} V_s[n-k] + \alpha_{m_{xy}} V_{dx}[n-k]$) represent the track-phase memory and kickback. The suffixes xy refer to the present track and chopper state x, and the last track and chopper state y.

For example, if there are 3 tracks, each can have one of 2 chopper states, x (the present state) can have 6 different values (i.e., 3 tracks×2 chopper states), while y (the past state) can have 4 different values (i.e., 2 possible tracks for the past sample x 2 chopper states). It is also possible to also account for more past states (e.g., n−2, n−3, etc.), and even future states (e.g., n+1) if needed. The calibration correction coefficients for each state are obtained by binning the samples used for the correlation/counting equations (as described in the previous sections) to find the gain and memory correction coefficients, e.g., $G_{xy}$, $\alpha_{xy}$, $\alpha_{mxy}$, etc., based on the present and past states.

Finally, the track-phase order-dependent gain and offset can be calibrated as follows:

$$V_{out_{corr}}[n] = V_{outth_{corr}}[n] + G_{txy} \cdot V_{outth_{corr}}[n] - V_{\mathit{off}_{txy}}[n] \quad (27)$$

$V_{outth_{corr}}$ is the T/H calibrated output given by equation (25) or (26), $G_{txy}$ is the track-phase interleaved gain correction coefficient, and $V_{\mathit{off}_{txy}}$ is the track-phase offset correction coefficient. The gain correction coefficient and the offset correction coefficient can be order-dependent and/or state-dependent. The gain and offset calibration in the track-phase can use the input signal and, if desired, any dither injected upstream.

The estimation of the track-phase memory correction coefficient is done starting with equation (22). If complete resetting of the $V_s$ node is employed, equation (22) becomes:

$$\alpha_{m_{xy}}[n+1] = \alpha_{m_{xy}}[n] + \mu \cdot \text{sign}(V_d[n-k]) \cdot \text{sign}(V_s[n] - \alpha_{m_{xy}}[n] \cdot V_d[n-k]) \quad (28)$$

In the above LMS equation (28), the sign of the held voltage $V_s[n]$ with the estimated $k^{th}$ past dither $\alpha_{m_{xy}}[n] \cdot V_d[n-k]$ removed is multiplied with the sign of kth past dither $V_d[n-k]$. $\mu$ is the step size for the LMS algorithm. The LMS algorithm converges to find the memory correction coefficient $\alpha_{m_{xy}}[n]$ that minimizes the memory error of the track-phase.

If the partial (or no) resetting is into account:

$$\alpha_{m_{xy}}[n+1] = \alpha_{m_{xy}}[n] + \mu \cdot \text{sign}(V_d[n-k]) \cdot \text{sign}(V_s[n] - \alpha_{m_{xy}}[n] \cdot \alpha_{RSTk}[n] \cdot (-1)^{PN[n-k]} \cdot V_s[n-k]) \quad (29)$$

Equation (29) implies that the coefficient $\alpha_{RSTk}$ is included for the estimation.

Extracting the Partial Resetting Correction Coefficient $\alpha_{RSTk}$

The coefficient $\alpha_{RST}$ can be adjusted in the foreground, or can be obtained in the background using an LMS equation. One method to estimate the partial resetting correction coefficient $\alpha_{RSTk}$ (i.e., $\alpha_{RST}$ of the (n−k)th sample is to estimate it from the hold-phase memory correction coefficient. By changing the analog circuit between two states: no resetting and resetting, and estimating the memory correction coefficient $\alpha_{xyz}$ in both cases, the ratio between the two hold-phase memory correction coefficients give an estimate of the partial resetting correction coefficient $\alpha_{RST}$. The two hold-phase memory correction coefficients can be determined based on Equation (14b).

In the case when no resetting is employed, the memory correction coefficient $\alpha_{xyz\_norst}$ can be estimated as follows:

$$\alpha_{xyz\_norst}[n+1] = \alpha_{xyz\_norst}[n] + \mu \cdot (-1)^{PN[n-1]} \cdot \text{sign}(V_{dx}[n-1]) \cdot \text{sign}(V_s[n] - \alpha_{xyz\_norst}[n] \cdot V_s[n-1]) \quad (30)$$

$\alpha_{xyz\_norst}$ is the no reset memory correction coefficient. In the above LMS equation (30), the sign of the held voltage $V_s[n]$ with the estimated no reset memory contribution $\alpha_{xyz\_norst}[n] \cdot V_s[n-1]$ removed is multiplied with the sign of past dither $V_{dx}[n-1]$ and the state of the past multiplicative dither value of the chopper $(-1)^{PN[n-1]}$. $\mu$ is the step size for the LMS algorithm.

In the case when partial resetting is employed, the memory correction coefficient $\alpha_{xyz\_rst}$ can be estimated as follows:

$$\alpha_{xyz\_rst}[n+1] = \alpha_{xyz\_rst}[n] + \mu \cdot (-1)^{PN[n-1]} \cdot \text{sign}(V_{dx}[n-1]) \cdot \text{sign}(V_s[n] - \alpha_{xyz\_rst}[n] \cdot V_s[n-1]) \quad (31)$$

$\alpha_{xyz\_rst}$ is the partial reset memory correction coefficient. In the above LMS equation (31), the sign of the held voltage $V_s[n]$ with the estimated partial reset memory contribution $\alpha_{xyz\_rst}[n] \cdot V_s[n-1]$ removed is multiplied with the sign of past dither $V_{dx}[n-1]$ and the state of the past multiplicative dither value of the chopper $(-1)^{PN[n-1]}$. $\mu$ is the step size for the LMS algorithm.

Therefore, partial resetting parameter $\alpha_{RSTk}$ can be estimated based on a ratio of the no reset memory coefficient $\alpha_{xyz\_norst}[n]$ and the partial reset memory coefficient $\alpha_{xyz\_rst}[n]$ computed based on equations (30) and (31) respectively:

$$\alpha_{RST} = \frac{\alpha_{xyz\_rst}}{\alpha_{xyz\_norst}} \quad (32)$$

$\alpha_{RST}$ is expected to be a fixed value unless there is track-dependence and/or order-dependence, which is captured by the suffixes such as xyz. In this case, different parameter values are used $\alpha_{RST}$ for each sample based on the track.

Another method to extract $\alpha_{RST}$ in the background takes advantage of the fact that the chopping sequence and the injected dither are uncorrelated sample-to-sample and with respect to each other. In this case, it is possible to find different track memory parameters for the signal and the dither separately to explicitly capture the $\alpha_{RST}$ parameter as follows:

Ignoring the order-dependence, the track-phase memory coefficient $\alpha_{m_{xy}}$ can be estimated as follows:

$$\alpha_{m_{xy}}[n+1] = \alpha_{m_{xy}}[n] + \mu \cdot V_d[n-k-1] \cdot (-1)^{PN[n-k-1]} \cdot (-1)^{PN[n-k]} (V_s[n] - (\alpha_{m_{xy}}[n]/\alpha_{xyz}[n]) \cdot V_s[n-k]) \quad (33)$$

$\alpha_{xyz}$ in equation (33) is the hold-phase memory correction coefficient. In the above LMS equation (33), the held voltage $V_s[n]$ with the estimated memory contribution from the $k^{th}$ past sample $(\alpha_{m_{xy}}[n]/\alpha_{xyz}[n]) \cdot V_s[n-k]$ removed is multiplied with the $k^{th}$ past multiplicative dither value of the chopper $(-1)^{PN[n-k]}$. The result is correlated with $k+1^{th}$ past dither $V_d[n-k-1]$ multiplied by the $k+1^{th}$ past multiplicative dither value of the chopper $(-1)^{PN[n-k-1]}$. $\mu$ is the step size for the LMS algorithm.

The corrected $V_s$ can be given by:

$$V_{s\_corr\_int}[n] = (V_s[n] - (\alpha_{m_{xy}}[n]/\alpha_{xyz}) \cdot V_s[n-k]) \quad (34)$$

$V_{s\_corr\_int}$ is an intermediate cleaned up $V_s$, which has the $\alpha_{RST}$ memory contribution $(\alpha_{m_{xy}}[n]/\alpha_{xyz}) \cdot V_s[n-k]$ removed. Subsequent estimations can be performed as follows:

$$\alpha_{mdith_{xy}}[n+1] = \alpha_{mdith_{xy}}[n] + \mu \cdot V_d[n-k] \cdot (V_{s\_corr\_int}[n] - \alpha_{mdith_{xy}}[n] \cdot V_d[n-k]) \quad (35)$$

$\alpha_{mdith_{xy}}$ in equation (35) is the track-phase memory correction coefficient of the dither. In the above LMS equation (35), the held voltage $V_s[n]$ with the estimated memory contribution from the $k^{th}$ past dither $\alpha_{mdith_{xy}}[n] \cdot V_d[n-k]$ removed is multiplied with the $k^{th}$ past $V_d[n-k]$. $\mu$ is the step size for the LMS algorithm.

Finally, the corrected output can be given by:

$$V_{s\_corr}[n] = \left(V_{s_{corr_{int}}}[n] - \alpha_{mdith_{xy}}[n] \cdot V_d[n-k]\right) \quad (36)$$

This correction can remove the track-phase memory components of both the signal and the dither, while correctly capturing the differences between the two.

System for Calibrating Track-Phase Errors

Figure 14:
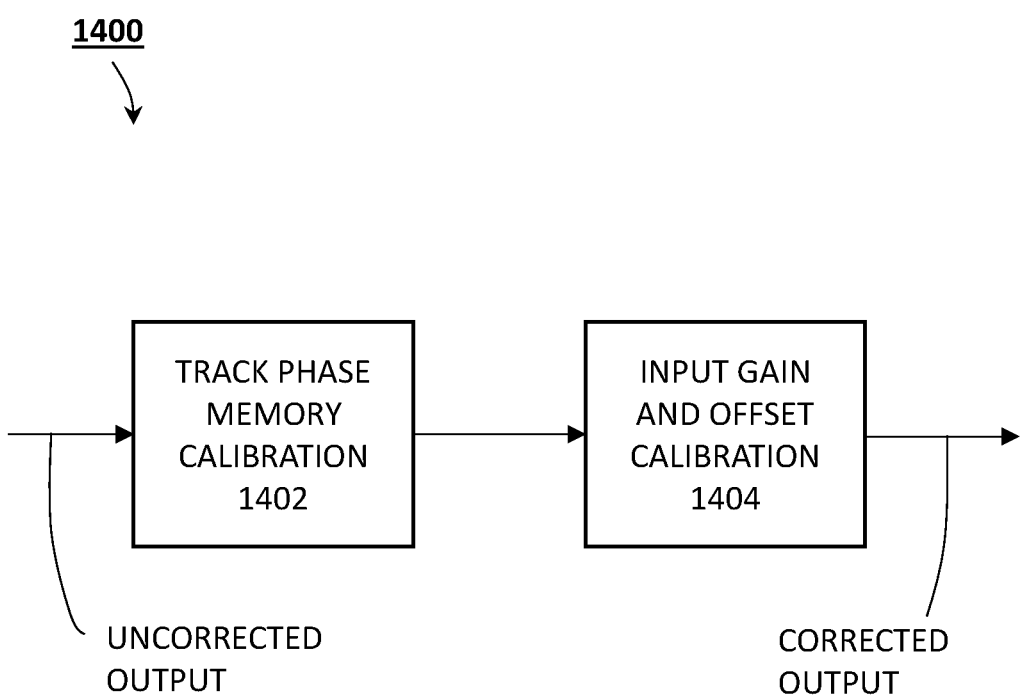
FIG. 14 illustrates calibration of track-phase memory calibration, and input gain and offset calibration, according to some embodiments of the disclosure.

FIG. 14 illustrates a system 1400 including calibration of track-phase memory calibration, and input gain and offset calibration, according to some embodiments of the disclosure. In 1402, track-phase memory error can be calibrated. In 1404, track-phase input gain and offset can be calibrated. For instance, the LMS equations described herein can be used in 1402, and 1404 to address these track-phase non-idealities. Binning is used to address order-dependent and state-dependent non-idealities. The track-phase memory calibration in 1402 can use the dither injected in the hold-phase. The order-dependent gain and offset calibration in 1404 can use the input signal. It can also use any dither injected upstream.

Figure 15:
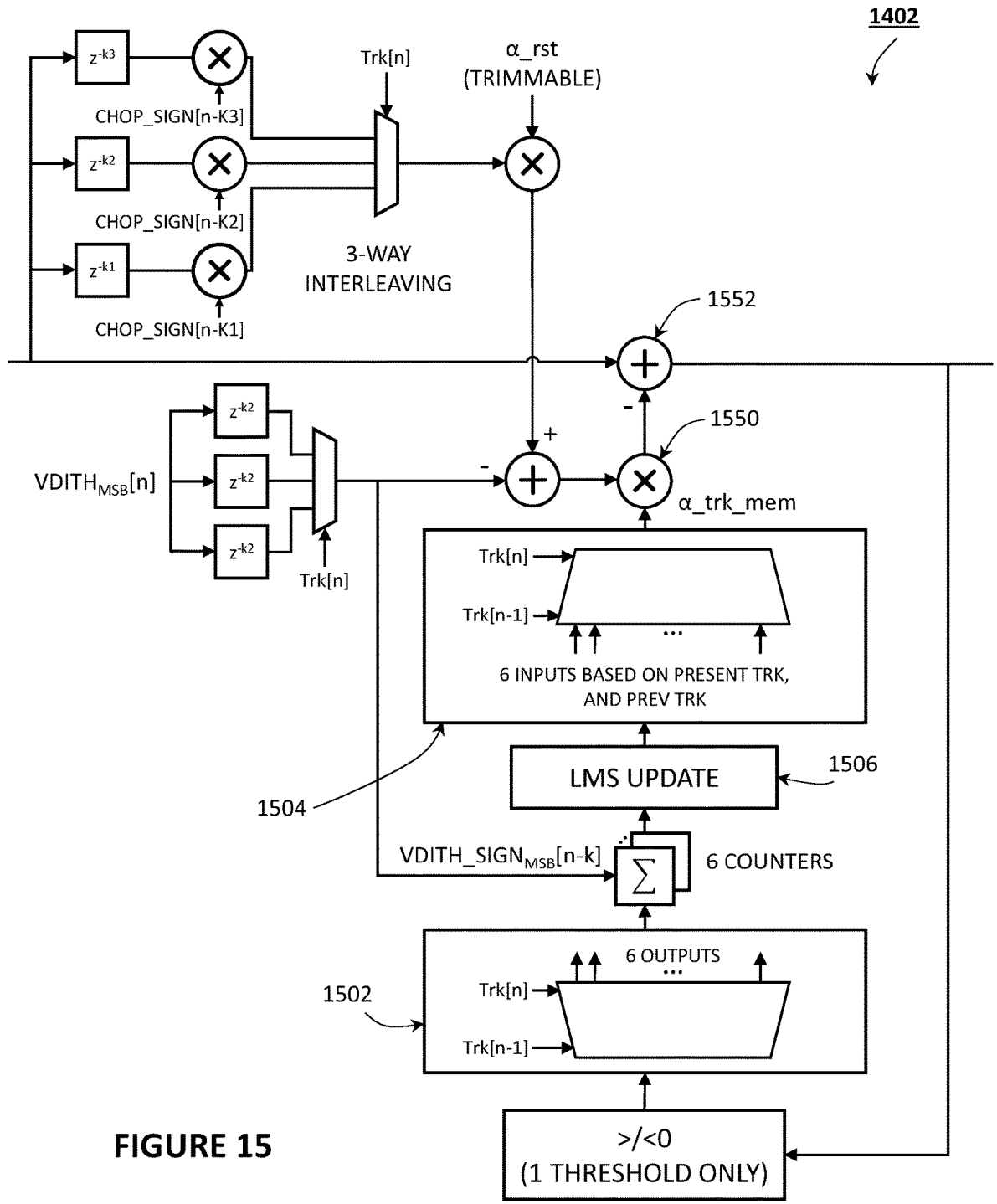
FIG. 15 illustrates an exemplary implementation for track-phase memory calibration, according to some embodiments of the disclosure.
Figure 16:
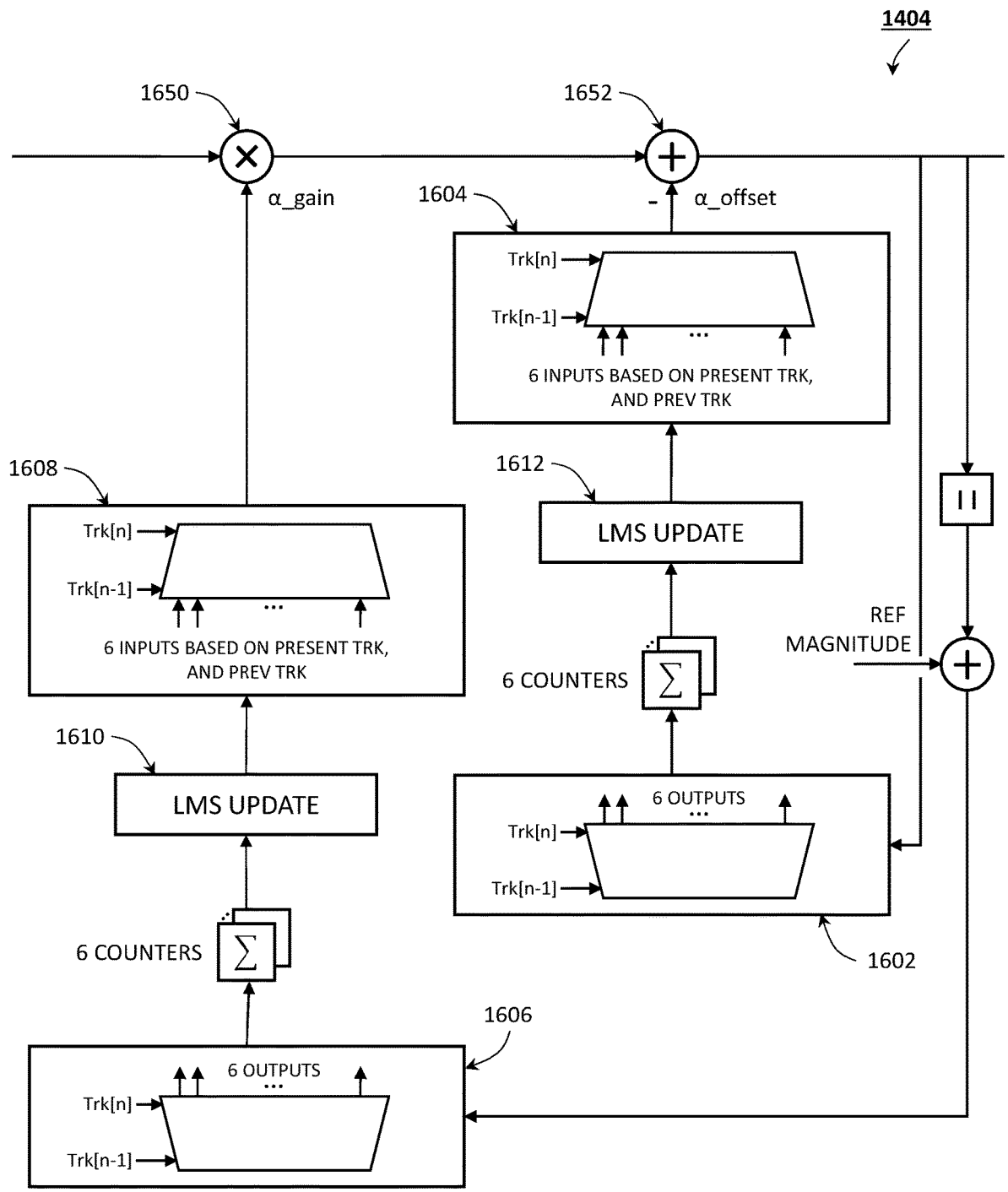
FIG. 16 illustrates an exemplary implementation for input gain and offset calibration, according to some embodiments of the disclosure.

FIGS. 15-16 show an exemplary implementation for track-phase non-idealities calibration in a 3-way randomly interleaved T/H circuit with optional dither injection and optional chopping. A histogram/counting based scheme can be used.

FIG. 15 illustrates an exemplary implementation for track-phase memory calibration 1402, according to some embodiments of the disclosure. Track-phase memory calibration 1402 includes mux 1502 to perform binning as described herein. Mux 1502 bins samples based on which time-interleaved sampling network is the present track Trk[n], and which time-interleaved sampling network was the previous track Trk[n−1]. In this example, the present track state Trk[n] has 3 possibilities, since the T/H circuit is a 3-way randomly interleaved T/H circuit with 3 time-interleaved sampling networks. The previous track state Trk[n−1] has 2 possibilities per each present track state Trk[n] (the same time-interleaved sampling network is not used twice consecutively/successively). As a result there are a total of 6 combinations of present track Trk[n] and previous track Trk[n−1].

Track-phase memory calibration 1402 also includes LMS update 1506, which represents a block for implementing the LMS equations described herein for track-phase memory calibration (e.g., implemented in digital circuitry and/or processor, such as an on-chip microprocessor). The different bins from mux 1502 serve to update different track-phase memory correction coefficients respectively. There are 6 track-phase memory correction coefficients, each corresponding to one of 6 combinations of present track Trk[n] and previous track Trk[n−1].

Mux 1504 performs selection to select the track-phase memory correction coefficient for correcting a sample based on present track Trk[n] and previous track Trk[n−1]. A selected track-phase memory coefficient (output from mux 1504) can be the track-phase memory coefficient (shown as $\alpha\_trk\_mem$) that can be used for correcting a given sample.

Memory (e.g., registers, shown as $z^{-k1}$, $z^{-k2}$, $z^{-k3}$ blocks) can be used for storing samples of the held output and the dither values so that the proper samples are used and applied in the correction to remove track-phase memory.

An estimated memory contribution in the track-phase is formed by multiplier 1550 and removed by summation node 1552, to generate a track-phase-memory-corrected output.

FIG. 16 illustrates an exemplary implementation for input gain and offset calibration 1404, according to some embodiments of the disclosure. Input gain and offset calibration 1404 includes mux 1602 and mux 1606 to perform binning as described herein. Mux 1606 bins samples based on which time-interleaved sampling network is the present track Trk[n], which time-interleaved sampling network was the previous track Trk[n−1]. Also, Mux 1602 bins samples based on which time-interleaved sampling network is the present track Trk[n], which time-interleaved sampling network was the previous track Trk[n−1]. In this example, the present track state Trk[n] has 3 possibilities, since the T/H circuit is a 3-way randomly interleaved T/H circuit with 3 time-interleaved sampling networks. The previous track state Trk[n−1] has 2 possibilities per each present track state Trk[n] (the same time-interleaved sampling network is not used twice consecutively/successively). As a result, there are a total of 6 combinations of present track Trk[n] and previous track Trk[n−1].

Input gain and offset calibration 1404 also includes LMS update 1610 and LMS update 1612 respectively. LMS update 1610 and LMS update 1612 represent the LMS equations described herein for track-phase input gain calibration and offset gain calibration respectively (e.g., implemented in digital circuitry and/or processor, such as an on-chip microprocessor). The different bins of samples from mux 1606 serve to update different gain correction coefficients respectively. Accordingly, there are 6 gain correction coefficients, each corresponding to one of the 6 combinations of present track Trk[n] and previous track Trk[n−1]. The different bins of samples from mux 1602 serve to update different offset correction coefficients respectively. Accordingly, there are 6 offset correction coefficients, each corresponding to one of the 6 combinations of present track Trk[n] and previous track Trk[n−1].

Mux 1608 performs selection to select the gain correction coefficient for correcting a sample based on the present track Trk[n] and previous track Trk[n−1]. A selected coefficient (output from mux 1608) can be the (estimated) input gain coefficient (shown as $\alpha\_gain$), that can be used for correcting a given sample. Mux 1604 performs selection to select the offset correction coefficient for correcting a sample based on the present track Trk[n] and previous track Trk[n−1]. A selected coefficient (output from mux 1604) can be the (estimated) offset coefficient (shown as $\alpha\_offset$) that can be used for correcting a given sample.

The multiplier 1650 can multiply the result from the previous calibration (e.g., track-phase-memory-corrected output from track-phase memory calibration 1402) by the (estimated) input gain coefficient to remove the input gain error. The summation node 1652 can subtract the result from the previous calibration (e.g., input gain calibration result from multiplier 1650) by the (estimated) offset coefficient to remove the offset error.

Examples

Figure 17:
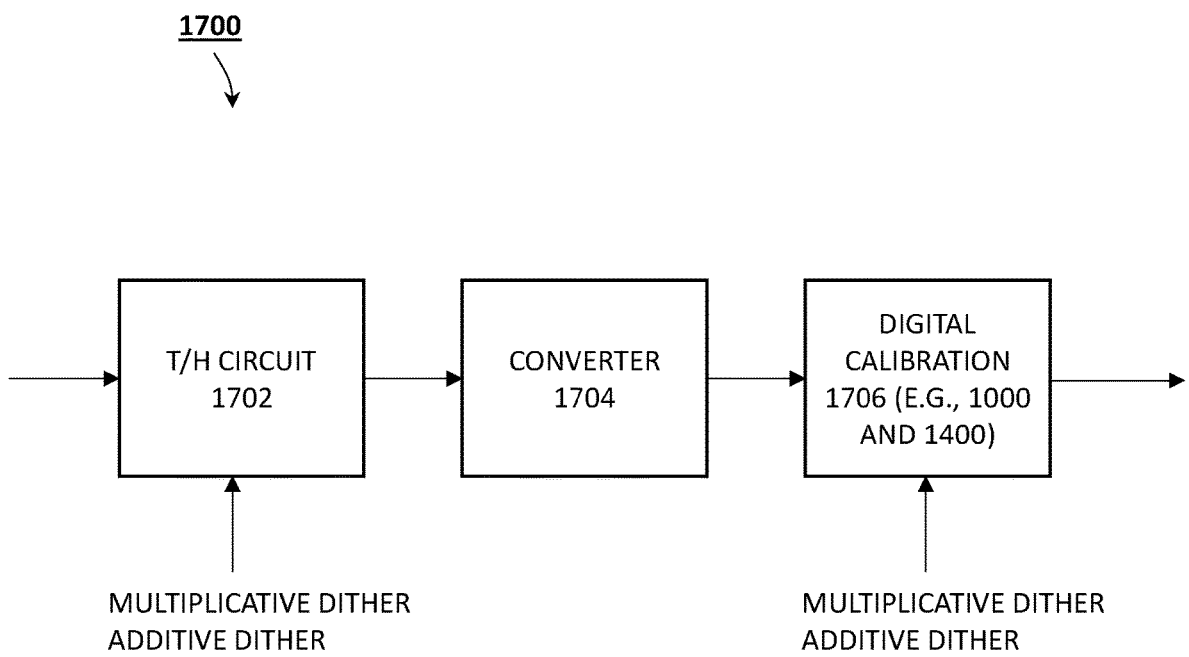
FIG. 17 illustrates a system with digital calibration, according to some embodiments of the disclosure.

FIG. 17 illustrates a system with digital calibration, according to some embodiments of the disclosure. The system includes a T/H circuit 1702, a converter 1704 which can digitize the output from T/H circuit 1702, and a digital calibration block 1706 which analyzes the digital samples/output from converter 1704 to extract non-idealities in the T/H circuit 1702 and apply digital correction to the digital samples. A closed-loop scheme can be used, where the correction is performed on the corrected digital samples/output. T/H circuit 1702 can be any one of the T/H circuits described herein. One or more dithers, e.g., multiplicative dither(s) and additive dither(s), can be injected at one or more suitable nodes to enable correction coefficients to be determined. Digital calibration logic/block 1706 can implement one or more of the techniques herein for the calibration of memory, kick-back, and order-dependent errors in interleaved T/H and amplifier switched-capacitor circuits with (or without) amplifier/buffer sharing. Specifically, the one or more dithers are used for correction coefficient determination. Binning enables determining order-dependent and/or state-dependent correction coefficients. LMS algorithms can be implemented to determine correction coefficients which can reduce the error of interest smaller. Exemplary implementations are illustrated by FIGS. 10-16. The techniques can be dither-based, and accommodate the presence of random chopping and randomization that can be employed to improve performance.

Example 1 is a method for addressing errors in time-interleaved sampling networks, comprising: injecting an additive dither in each time-interleaved sampling network, each time-interleaved sampling network sampling an input signal in a randomized sequence; quantizing outputs of the time-interleaved sampling networks to generate a digital output; updating different correction coefficients for a first time-interleaved sampling network based on the additive dither, using samples of the digital output generated according to different orders in which the time-interleaved sampling networks sample the input signal; and correcting the digital output corresponding to the different orders separately, using the different correction coefficients.

In Example 2, the method of Example 1 can optionally include updating different correction coefficients comprising: updating a first correction coefficient for the first time-interleaved sampling network based on the additive dither and samples of the digital output that correspond to a first order of time-interleaved sampling networks sampling the input signal; and updating a second correction coefficient for the first time-interleaved sampling network based on the additive dither and samples of the digital output that correspond to a second order of time-interleaved sampling networks sampling the input signal.

In Example 3, the method of Example 2 can optionally include correcting the digital output comprises: correcting samples of the digital output that correspond to the first order based on the first correction coefficient; and correcting samples of the digital output that correspond to the second order based on the second correction coefficient.

In Example 4, the method of any one of Examples 1-3 can optionally include the different orders specify which one of the time-interleaved sampling networks generated one or more of the following: a given sample, a previous sample, and a subsequent sample.

In Example 5, the method of any one of Examples 1-4 can optionally include injecting a multiplicative dither in each time-interleaved sampling network.

In Example 6, the method of Example 5 can optionally include updating the different correction coefficients comprising: updating the different correction coefficients using samples of the digital output generated according to: (1) the different orders, and (2) different values of the multiplicative dither corresponding to one or more of the following: a given sample, a previous sample, and a subsequent sample.

In Example 7, the method of any one of Examples 1-6 can optionally include updating the different correction coefficients comprising: adaptively adjusting the different correction coefficients, based on corrected samples of the digital output and the additive dither, to reduce the errors.

In Example 8, the method of any one of Examples 1-7 can optionally include: one of the errors being defined based on the additive dither and a sample of the digital output with an estimate of the additive dither removed; and the estimate of the additive dither being based on the additive dither and a corresponding correction coefficient.

In Example 9, the method of any one of Examples 1-8 can optionally include: one of the errors being defined based on the additive dither corresponding to a previous sample of the digital output and a sample of the digital output with an estimate of a memory contribution removed; and the estimate of the memory contribution being based on the previous sample of the digital output and a corresponding correction coefficient.

In Example 10, the method of any one of Examples 1-9 can optionally include: one of the errors being defined based on the additive dither corresponding to a previous sample of the digital output generated by the first time-interleaved sampling network and a sample of the digital output with an estimate of a memory contribution removed; and the estimate of the memory contribution being based on the previous sample of the digital output generated by the first time-interleaved sampling network and a corresponding correction coefficient.

In Example 11, the method of any one of Examples 1-10 can optionally include: one of the errors is defined based on a sample of the digital output and an estimate of offset.

In Example 12, the method of any one of Examples 1-11 can optionally include correcting the digital output comprising: correcting the digital output for memory errors before correcting for offset and/or gain errors.

In Example 13, the method of any one of Examples 1-12 can optionally include correcting the digital output comprising: correcting the digital output for offset errors before removing the multiplicative dither from the digital output.

In Example 14, the method of any one of Examples 1-13 can optionally include: the different correction coefficients comprising correction coefficients to reduce memory error due to partial resetting of the time-interleaved sampling networks.

In Example 15, the method of any one of Examples 1-14 can optionally include: resetting a summing node of the time-interleaved sampling networks by overlapping a sampling clock signal and a hold clock signal.

In Example 16, the method of any one of Examples 1-15 can optionally include: resetting the first time-interleaved sampling network when the first time-interleaved sampling network remains idle for more than one phase.

In Example 17, the method of any one of Examples 1-16 can optionally include: the errors comprising non-idealities in a hold-phase of the first time-interleaved sampling network.

In Example 18, the method of any one of Examples 1-17 can optionally include the errors comprising: hold-phase gain error, hold-phase memory error, hold-phase offset error.

In Example 19, the method of any one of Examples 1-17 can optionally include the errors comprising: hold-phase non-linearities.

In Example 20, the method of any one of Examples 1-17 can optionally include the errors comprising non-idealities in a track-phase of the first time-interleaved sampling network.

In Example 21, the method of any one of Examples 1-17 can optionally include the errors comprising: track-phase gain error, track-phase memory error, and track-phase offset error.

Example 22 is a method for addressing errors in time-interleaved sampling networks, comprising: injecting an additive dither and a multiplicative dither in each time-interleaved sampling network, each time-interleaved sampling network sampling an input signal in a sequence; quantizing outputs of the time-interleaved sampling networks to generate a digital output; updating different correction coefficients for a first time-interleaved sampling network based on the additive dither, using samples of the digital output generated according to different values of the multiplicative dither; and correcting the digital output corresponding to the different values of the multiplicative dither separately, using the different correction coefficients.

In Example 23, the method of Example 22 can optionally include updating the different correction coefficients comprising: updating a first correction coefficient for the first time-interleaved sampling network based on the additive dither and samples of the digital output that correspond to a first value of the multiplicative dither; and updating a second correction coefficient for the first time-interleaved sampling network based on the additive dither and samples of the digital output that correspond to a second value of the multiplicative dither.

In Example 24, the method of Example 23 can optionally include correcting the digital output comprising: correcting samples of the digital output that correspond to the value of the multiplicative dither; and correcting samples of the digital output that correspond to the value of the multiplicative dither.

In Example 25, the method of any one of Examples 22-24 can optionally include the different values of the multiplicative dither comprising +1 and −1.

In Example 26, the method of any one of Examples 22-25 can optionally include injecting a multiplicative dither comprising changing a polarity of a differential signal in the first time-interleaved sampling network when a value of the multiplicative dither is −1.

In Example 27, the method of any one of Examples 22-26 can optionally include updating the different correction coefficients comprising: updating the different correction coefficients using samples of the digital output generated according to: (1) different orders in which the time-interleaved sampling networks sample the input signal, and (2) the different values of the multiplicative dither corresponding to one or more of the following: a given sample, a previous sample, and a subsequent sample.

In Example 28, the method of any one of Examples 22-27 can optionally include updating the different correction coefficients comprising adaptively adjusting the different correction coefficients, based on corrected samples of the digital output and the additive dither, to reduce the errors.

In Example 29, the method of any one of Examples 22-28 can optionally include: one of the errors being defined based on the additive dither and a sample of the digital output with an estimate of the additive dither removed; and the estimate of the additive dither being based on the additive dither and a corresponding correction coefficient.

In Example 30, the method of any one of Examples 22-29 can optionally include: one of the errors being defined based on the additive dither corresponding to a previous sample of the digital output and a sample of the digital output with an estimate of a memory contribution removed; and the estimate of the memory contribution being based on the previous sample of the digital output and a corresponding correction coefficient.

In Example 31, the method of any one of Examples 22-30 can optionally include: one of the errors being defined based on the additive dither corresponding to a previous sample of the digital output generated by the first time-interleaved sampling network and a sample of the digital output with an estimate of a memory contribution removed; and the estimate of the memory contribution being based on the previous sample of the digital output generated by the first time-interleaved sampling network and a corresponding correction coefficient.

In Example 32, the method of any one of Examples 22-31 can optionally include: one of the errors being defined based on a sample of the digital output and an estimate of offset.

In Example 33, the method of any one of Examples 22-32 can optionally include correcting the digital output comprising: correcting the digital output for memory errors before correcting for offset and/or gain errors.

In Example 34, the method of any one of Examples 22-33 can optionally include correcting the digital output comprising: correcting the digital output for offset errors before removing the multiplicative dither from the digital output.

In Example 35, the method of any one of Examples 22-34 can optionally include the different correction coefficients comprising correction coefficients to reduce memory error due to partial resetting of the time-interleaved sampling networks.

In Example 36, the method of any one of Examples 22-35 can optionally include resetting a summing node of the time-interleaved sampling networks by overlapping a sampling clock signal and a hold clock signal.

In Example 37, the method of any one of Examples 22-36 can optionally include: resetting the first time-interleaved sampling network when the first time-interleaved sampling network remains idle for more than one phase.

In Example 38, the method of any one of Examples 22-37 can optionally include: the errors comprising non-idealities in a hold-phase of the first time-interleaved sampling network.

In Example 39, the method of any one of Examples 22-38 can optionally include the errors comprising: hold-phase gain error, hold-phase memory error, hold-phase offset error.

In Example 40, the method of any one of Examples 22-39 can optionally include the errors comprising: hold-phase non-linearities.

In Example 41, the method of any one of Examples 22-40 can optionally include the errors comprising non-idealities in a track-phase of the first time-interleaved sampling network.

In Example 42, the method of any one of Example 22-41 can optionally include the errors comprising: track-phase gain error, track-phase memory error, and track-phase offset error.

Example 43 is a system with calibration, comprising: track-and-hold circuit to receive an analog input, wherein the track-and-hold circuit comprises randomized time-interleaved sampling networks, and each time-interleaved sampling network has additive dither injection circuitry; analog-to-digital converter to digitize an output from the track-and-hold circuit; and digital calibration logic to: determine different correction coefficients separately using samples of a digital output from the analog-to-digital converter generated according to different orders in which the randomized time-interleaved sampling networks sample the analog input, and correct a digital output from the analog-to-digital converter using the different correction coefficients.

In Example 44, the system of Example 43 can optionally include: each time-interleaved sampling network has a random chopper; and the digital calibration logic is further to determine the different correction coefficients separately for the different orders and for different states of the random chopper.

In Example 45, the system of Example 44 can optionally include: memory, for each randomized time-interleaved sampling network, to store a last sample of the digital output generated using the given randomized time-interleaved sampling network.

Example 1001 is a method for calibrating one or more of the following: memory, kick-back, chopper state-dependent offset, chopper state-dependent gain errors, order-dependent offset, and order-dependent gain errors in the hold-/gain-phase of a switched-capacitor interleaved T/H or amplifier. The circuit can be open-loop or closed-loop and utilizes injected dither for calibration. The calibration can be done utilizing correlation or histograms/counting. The calibration of these effects can accommodate or take into account buffer/amplifier sharing, randomization, and random chopping.

Example 1002 is a method for calibrating one or more of the following: memory, kick-back, chopper state-dependent offset, chopper state-dependent gain errors, order-dependent offset, and order-dependent gain errors in the track (or sample) phase of a switched-capacitor interleaved T/H or amplifier. The circuit can be open-loop or closed-loop. It can utilize the same dither injected in the hold-phase, or separate dither injected for the track-/sampling-phase. The calibration of these effects can accommodate buffer/amplifier sharing, randomization, and random chopping.

Example 1003 is a method for performing both track (or sample) phase and hold-phase calibrations in one framework that takes advantage of commonalities to reduce processing, correction, etc.

Example 1004 is a method for carrying out a timing scheme that enables the resetting of the summing node by employing clock overlapping.

Example 1005 is a method for binning that efficiently keeps track of the last sample of each network/track by storing the last sample from each track. Memory elements such as registers can be used. For 3 interleaved networks, 3 registers can be used, each register stores the last sample used in each track. The memory elements are used for track-phase calibration and correction.

Example 1006 is a method for resetting that simplifies the memory calibration with minimal overhead by resetting the old (i.e., stale) memory in un-used tracks/networks that are older than n−2.

Example 1007 is a method to extract the resetting parameter $\alpha_{RST}$.

Example A is an apparatus comprising means for implementing/carrying out any one of the methods described herein.

Variations and Implementations

As seen in FIGS. 2, 3, and 6-8, the additive dither is injected using the capacitor that is also sampling the input signal. Note that by using the same capacitor that is also sampling the input signal to inject the dither, the dither may remain on the capacitor and cause kick-back errors. This implementation can be referred to as shared-capacitor dither injection. Alternatively, a dither capacitor, separate from the capacitor sampling the input signal, can be used to inject the additive dither in the switched-capacitor network of the T/H circuit. This implementation can be referred to as a split-capacitor dither injection. The dither capacitor can be connected to a summing node of the switched-capacitor network. Using a separate capacitor allows the dither to be isolated from the capacitor that is sampling the input signal and avoid/reduce kick-back errors.

There are several considerations to take into account when using the same capacitor to sample the input signal and to inject an additive dither. Settling in the hold-phase is faster. There is better/lower loss due to fewer capacitors connected to a summing node of the switched-capacitor network. There are fewer switches and clock signals needed to control the switches, which means less power consumption and less complexity. As mentioned before, the dither is not removed from the capacitor that is also performing sampling when switching from the hold-phase to the sample phase. The dither can kick the input and kick-back calibration may be needed to remove the error caused by the kick-back to achieve a certain level of performance (and reduce distortions).

There are also several considerations to take into account when using a dither capacitor separate from the capacitor performing the sampling. Settling in the hold-phase is slower, since time is need to charge the dither capacitor during the hold-phase to inject the dither. There is worse/more loss due to more capacitors connected to the summing node of the switched-capacitor network. Having a separate dither capacitor also means there are more switches and clock signals needed to control the switches, which means more power consumption and more complexity. As mentioned before, the separate dither capacitor can isolate the dither from the capacitor performing the sampling of the input signal, which means that kick-back can be prevented. Moreover, the isolation of the dither capacitor allows for resetting/removal of the dither, which means there is less interaction between the dither and the input. In addition, when a separate dither capacitor is used to inject the dither, the track-phase memory calibration is simplified, since $V_d[n-k]$ is injected using the separate dither capacitor that is not used for sampling, and only $V_s[n-k]$ exists on the sampling capacitor. This means that $V_d[n-k]$ in various correction equations to remove track-phase memory (e.g., Equations 20, 23, 25, and 26) can be removed.

FIGS. 18-21 illustrate split-capacitor dither injection in various sampling networks. While only one sampling network is shown, it is envisioned by the disclosure that two or more sampling networks can be included to implement time-interleaving. Moreover, the two or more time-interleaved sampling networks can share a single hold buffer. In some cases, the two or more time-interleaved sampling network have dedicated hold buffers for each time-interleaved sampling network. For instance, any one of sampling networks illustrated in FIGS. 18-21 can implemented in place of the sampling networks seen in FIGS. 2, 3, and 6-8. Additive dither is injected in the various sampling networks and can be used to as the additive dither in some of the calibration schemes described herein.

Figure 18:
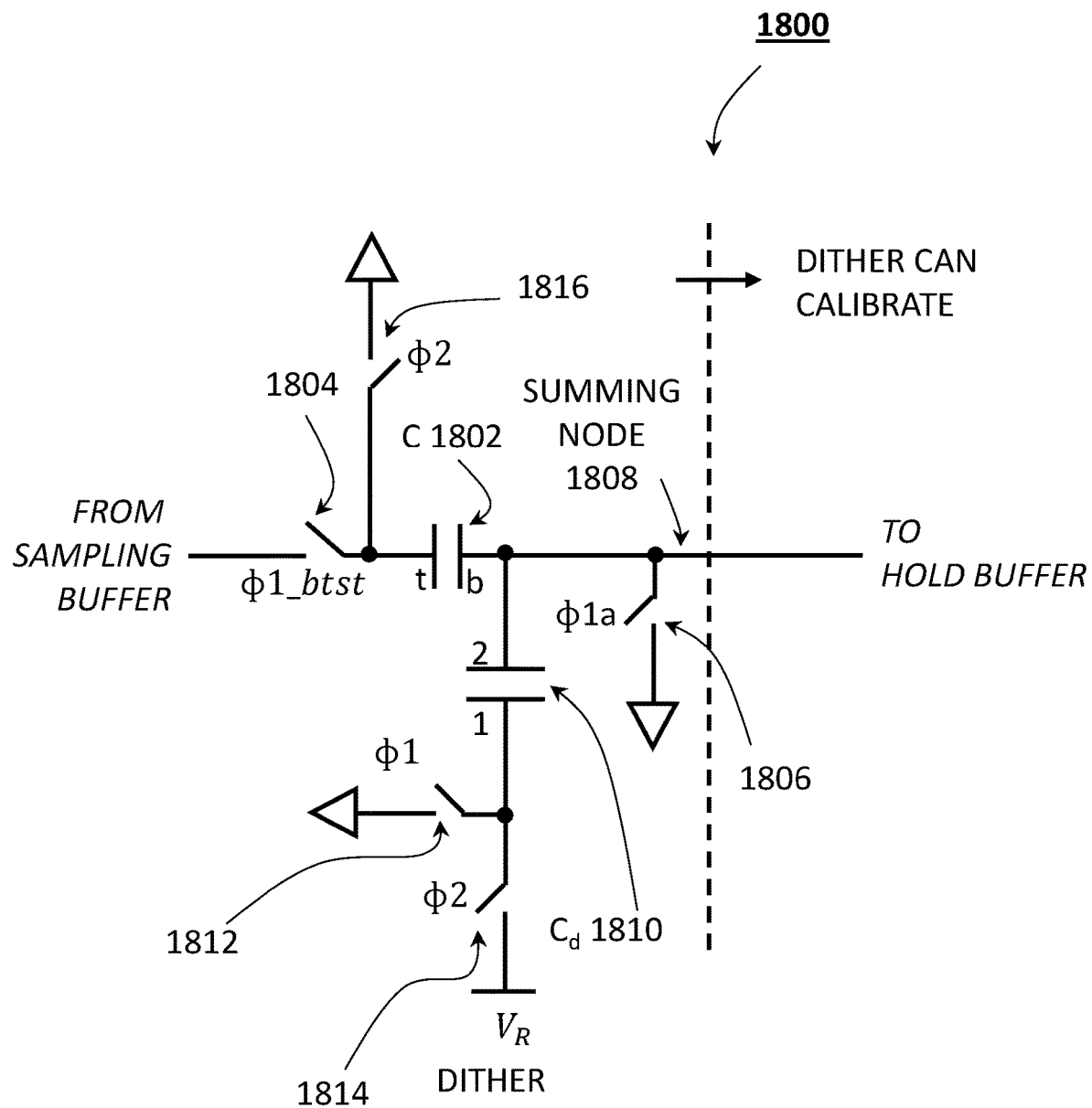
FIGS. 18-21 show exemplary sampling networks implementing split-capacitor dither injection, according to some embodiments of the disclosure.

FIG. 18 shows an exemplary sampling network 1800 with split-capacitor dither injection, according to some embodiments of the disclosure. The sampling network 1800 has capacitor C 1802 for sampling the input, an input switch 1804 for receiving the (buffered) input from a sampling buffer, a sampling switch 1806. The sampling network 1800 includes a dither injection switched-capacitor network. The dither injection switched-capacitor network is added to a summing node 1808 of the sampling network 1800, which is at the input of hold buffer. The dither injection switched-capacitor network includes dither capacitor $C_d$ 1810, a reset switch 1812 to connect a first plate (labeled as "1") of the dither capacitor $C_d$ 1810 to ground, and a dither injection switch 1814 to connect the first plate of the dither capacitor $C_d$ 1810 to node $V_R$. Furthermore, a transfer switch 1816 is added to connect the top plate of the capacitor C 1802 to ground.

In the sampling network 1800, a dither voltage level provided at node $V_R$ is injected using a dither capacitor $C_d$ 1810 at the input of the hold buffer, which is also the bottom plate of capacitor C 1802. A dither voltage level can be provided at node $V_R$. A second plate (labeled as "2") of the dither capacitor $C_d$ 1810 is connected to the bottom plate of capacitor C 1802, which is also the summing node 1808. The first plate (labeled as "1") of the dither capacitor $C_d$ 1810 is connected to ground during φ1 (sample phase). The first plate of the dither capacitor $C_d$ 1810 is connected to node $V_R$ during φ2 (hold-phase).

During sample phase, the input switch 1804 having phase φ1_btst and the sampling switch 1806 having phase φ1a are closed. The input switch 1804 connects the top plate of the capacitor C 1802 to sample the input signal (e.g., sample the output of sampling buffer) onto the capacitor C 1802. The sampling switch 1806 connects the bottom plate of the capacitor C 1802 to ground. The input switch 1804 can be a bootstrapped switch (i.e., bootstrapped to the buffered input) to achieve good linearity. The sampling switch 1806 having phase φ1a is advanced (opens before the input switch 1806 is opened at the end of the sample phase) to achieve bottom plate sampling. The reset switch 1812 having phase φ1 is closed, and so is the sampling switch 1806 having phase φ1a at the beginning of the sample phase. When the reset switch 1812 and the sampling switch 1806 are closed, the first plate of the dither capacitor $C_d$ 1810 is connected to ground, and the second plate of the dither capacitor $C_d$ 1810 is connected to ground. Closing the reset switch 1812 and the sampling switch 1806 thus clears/resets the dither capacitor $C_d$ 1810. The dither injection switch 1814 having phase φ2 is opened and the transfer switch 1816 having phase φ2 are open during the sample phase. At the end of the sample phase, the input signal is sampled onto capacitor C 1802, and the dither capacitor $C_d$ 1810 is cleared/reset.

During a hold-phase, the input switch 1804 having phase φ1_btst, the sampling switch 1806 having phase φ1a, and the reset switch 1812 having phase φ1 are opened. Dither injection switch 1814 having phase φ2 closes to connect the first plate of the dither capacitor $C_d$ 1810 to the node $V_R$. Transfer switch 1816 having phase φ2 closes to connect the top plate of capacitor C 1802 to ground to transfer the sampled input to the summing node 1808. Additive dither can be injected in the sampling network 1800 and is added at the summing node 1808. Accordingly, the input signal and the additive dither appear at the summing node 1808 of the sampling network 1800 (e.g., the input of a hold buffer).

In this embodiment, the output bias point of a sampling buffer does not need to be compatible with the input bias point of a hold buffer. The output of the sampling network 1800 is an inverted version of the input to the sampling network 1800 plus the additive dither injected at node $V_R$.

Figure 19:
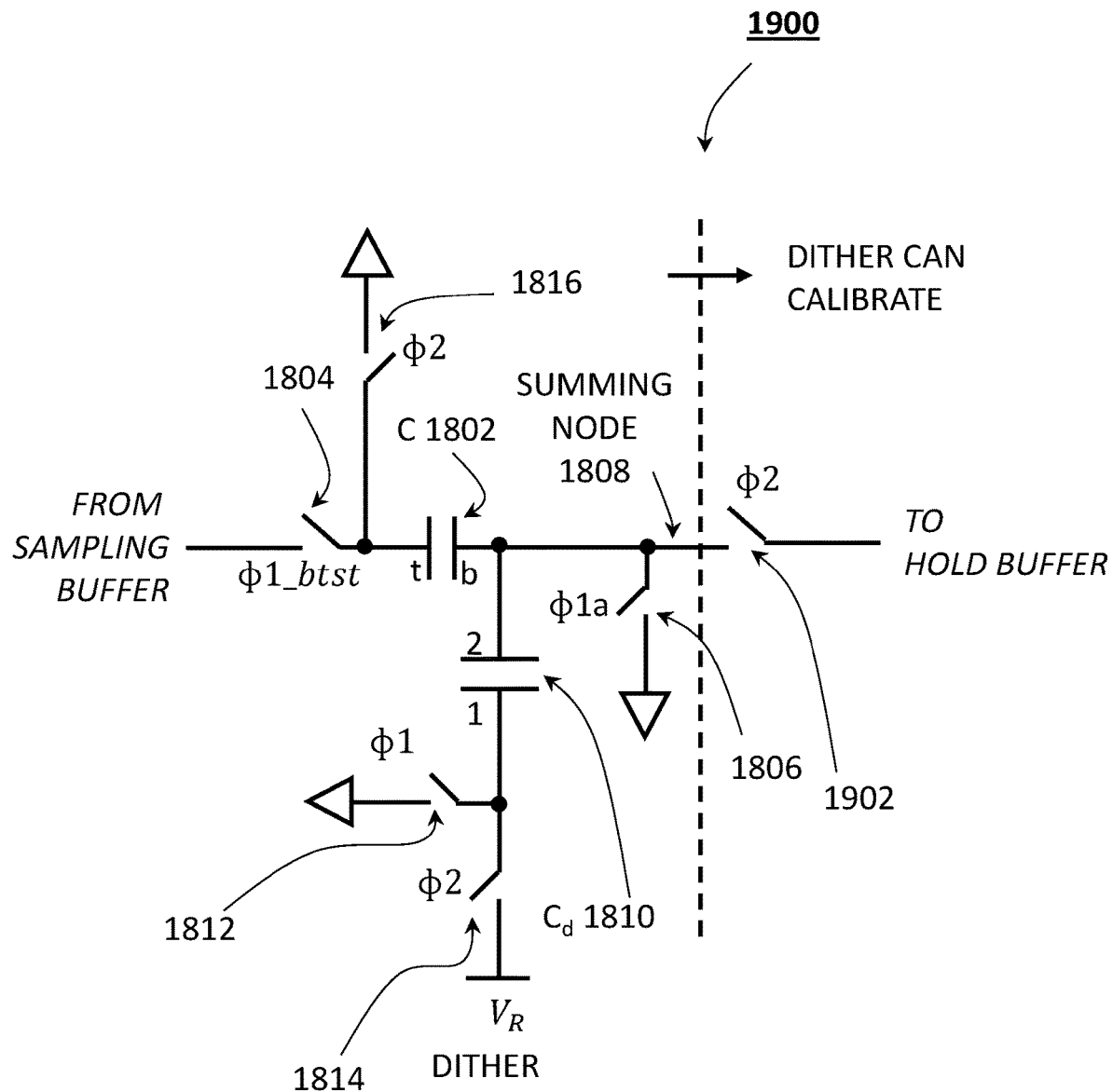

FIG. 19 shows another exemplary sampling network 1900 with split-capacitor dither injection, according to some embodiments of the disclosure. FIG. 19 is similar to FIG. 18, where FIG. 19 adds an output switch 1902. The sample phase and hold-phase operations are the same as FIG. 18, but an additional switch (i.e., the output switch 1902) is provided at the summing node 1808. The output switch 1902 having phase φ2 disconnects the summing node 1808, i.e., the bottom plate of capacitor C 1802 and the second plate of dither capacitor $C_d$ 1810, from the input of a hold buffer during the sample phase. When the output switch 1902 is open, the output switch 1902 can isolate the sampling network 1800 from the hold buffer (and vice versa). The output switch 1902 having phase φ2 connects the summing node 1808, i.e., the bottom plate of capacitor C 1802 and the second plate of dither capacitor $C_d$ 1810, to the input of the hold buffer during the hold-phase. The output switch 1902 thus transfers the input signal and the additive dither appearing at the summing node 1808 to the hold buffer. The output switch 1902 does not have to be bootstrapped for linearity, if the additive dither is used to calibrate out the non-linearity of the output switch 1902.

Figure 20:
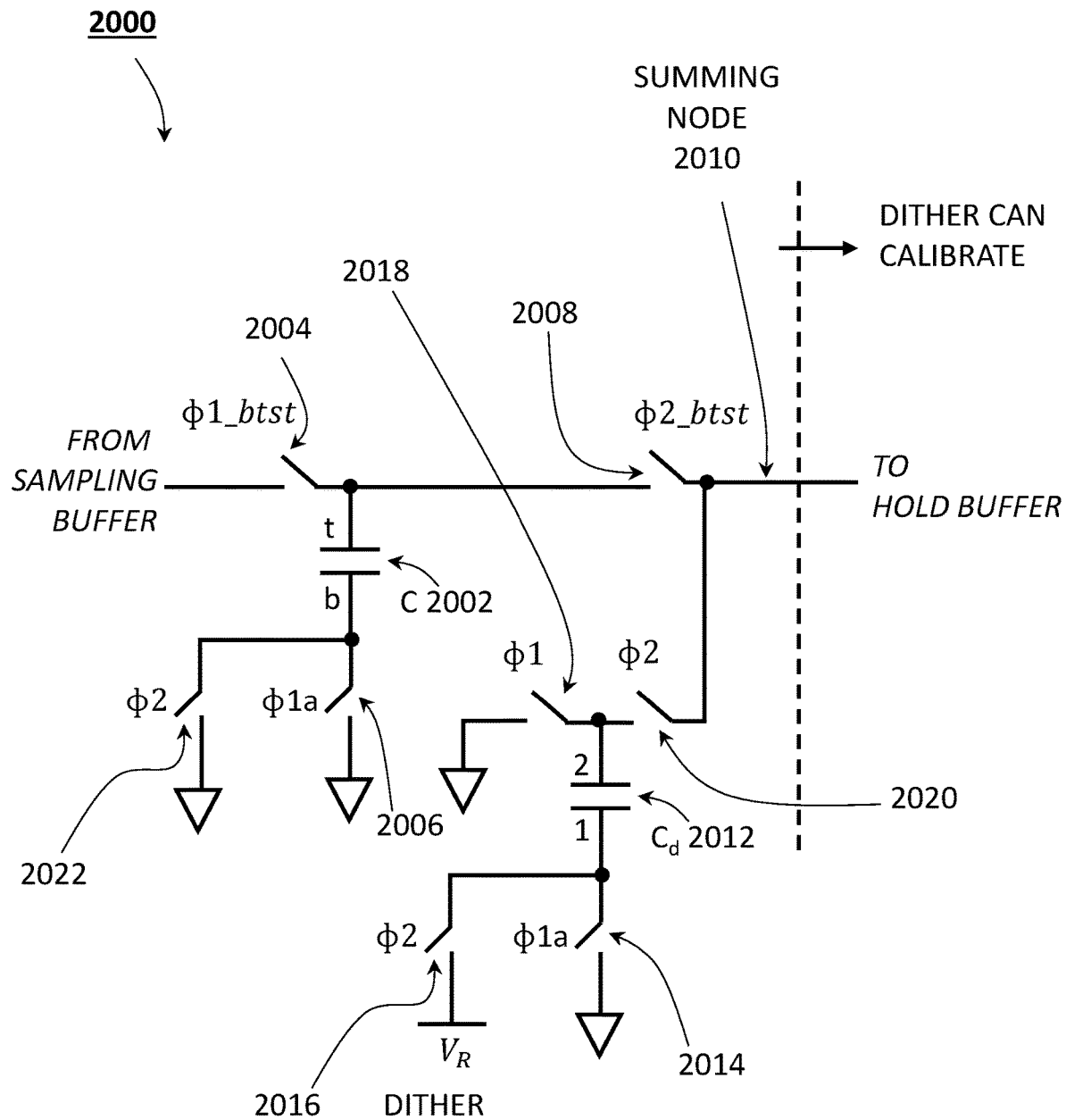

FIG. 20 shows yet another exemplary sampling network 2000 with split-capacitor dither injection, according to some embodiments of the disclosure. The sampling network 2000 has capacitor C 2002 for sampling the input, an input switch 2004 for receiving the (buffered) input from a sampling buffer, a sampling switch 2006, and an output switch 2008. The sampling network 2000 includes a dither injection switched-capacitor network. The dither injection switched-capacitor network is added to a summing node 2010 of the sampling network 2000, which is at the input of a hold buffer, and downstream from the output switch 2008. The dither injection switched-capacitor network includes dither capacitor $C_d$ 2012, a first reset switch 2014 to connect a first plate (labeled as "1") of the dither capacitor $C_d$ 2012 to ground, a dither injection switch 2016 to connect the first plate of the dither capacitor $C_d$ 2012 to node $V_R$, a second reset switch 2018 to connect the second plate (labeled as "2") of the dither capacitor $C_d$ 2012 to ground, and a dither transfer switch 2020 to connect the second plate of the dither capacitor $C_d$ 2302 to the summing node 2320. Furthermore, a transfer switch 2022 is added to connect the bottom plate of the capacitor C 2002 to ground.

In the sampling network 2000, a dither voltage level provided at node $V_R$ is injected using a dither capacitor $C_d$ 2012 at the input of a hold buffer. A dither voltage level can be provided at node $V_R$. A second plate (labeled as "2") of the dither capacitor $C_d$ 2012 is connected to ground during φ1 (sample phase). The second plate of the dither capacitor $C_d$ 2012 is connected to the summing node 2010 during phase φ2 (hold-phase). The first plate (labeled as "1") of the dither capacitor $C_d$ 2012 is connected to ground during φ1 (sample phase). The first plate of the dither capacitor $C_d$ 2012 is connected to node $V_R$ during φ2 (hold-phase).

During sample phase, the input switch 2004 having phase φ1_btst and the sampling switch 2006 having phase φ1a are closed. The input switch 2004 connects the top plate of the capacitor C 2002 to sample the input signal (e.g., sample the output of a sampling buffer) onto the capacitor C 2002. The sampling switch 2006 connects the bottom plate of the capacitor C 2002 to ground. The input switch 2004 can be a bootstrapped switch (i.e., bootstrapped to the buffered input) to achieve good linearity. The sampling switch 2006 having phase φ1a is advanced (opens before the input switch 2004 is opened at the end of the sample phase) to achieve bottom plate sampling. The second reset switch 2018 having phase φ1 is closed, and so is the first reset switch 2014 having phase φ1a at the beginning of the sample phase. The first reset switch 2014 having phase φ1a is advanced (opens before second reset switch 2018 is opened at the end of the sample phase) to achieve bottom plate sampling. When the first reset switch 2014 and the second reset switch 2018 are closed, the first plate of the dither capacitor $C_d$ 2012 is connected to ground, and the second plate of the dither capacitor $C_d$ 2012 is connected to ground. Closing the first reset switch 2014 and second reset switch 2018 thus clears/ resets the dither capacitor $C_d$ 2012. The dither injection switch 2016 having phase φ2, the dither transfer switch 2020 having phase φ2, the output switch 2008 having phase φ2_btst, and the transfer switch 2022 having phase φ2 are open during the sample phase. At the end of the sample phase, the input signal is sampled onto capacitor C 2002, and the dither capacitor $C_d$ 2012 is cleared/reset.

During a hold-phase, the input switch 2004 having phase φ1_btst, the sampling switch 2006 having phase φ1a, the first reset switch 2014 having phase φ1a, and the second reset switch 2018 having phase φ1 are opened. Dither injection switch 2016 having phase φ2 closes to connect the first plate of the dither capacitor $C_d$ 2012 to the node $V_R$. Dither transfer switch 2020 having phase φ2 closes to connect the second plate of the dither capacitor $C_d$ 2012 to the summing node 2010 to transfer the dither (or adds the dither) to the summing node 2010. Output switch 2008 also closes to connect the top plate of capacitor 2002 to the summing node 2010. Transfer switch 2022 having phase φ2 closes to connect the bottom plate of capacitor C 2002 to ground to transfer the sampled input to the summing node 2010. Accordingly, the input signal and the additive dither appear at the summing node 2010 of the sampling network 2000 (e.g., input of the hold buffer).

In this embodiment, the output bias point of a sampling buffer is preferably compatible with the input bias point of hold buffer. The output of sampling network 2000 is a non-inverted version of the input to the sampling network 2000 plus the additive dither injected at node $V_R$.

The output switch 2008 can optionally be a bootstrapped switch to achieve good linearity. Compared to the sampling network in FIG. 18, the sampling network 2000 can have two bootstrapped switches (instead of just one), which can be more complicated and expensive. However, having the two bootstrapped switches can provide better isolation, and can be particularly beneficial to implementations where more than one sampling network is used (e.g., a plurality of sampling networks are sampling in a time-interleaved fashion and the sampling networks are sharing a single hold buffer).

Figure 21:
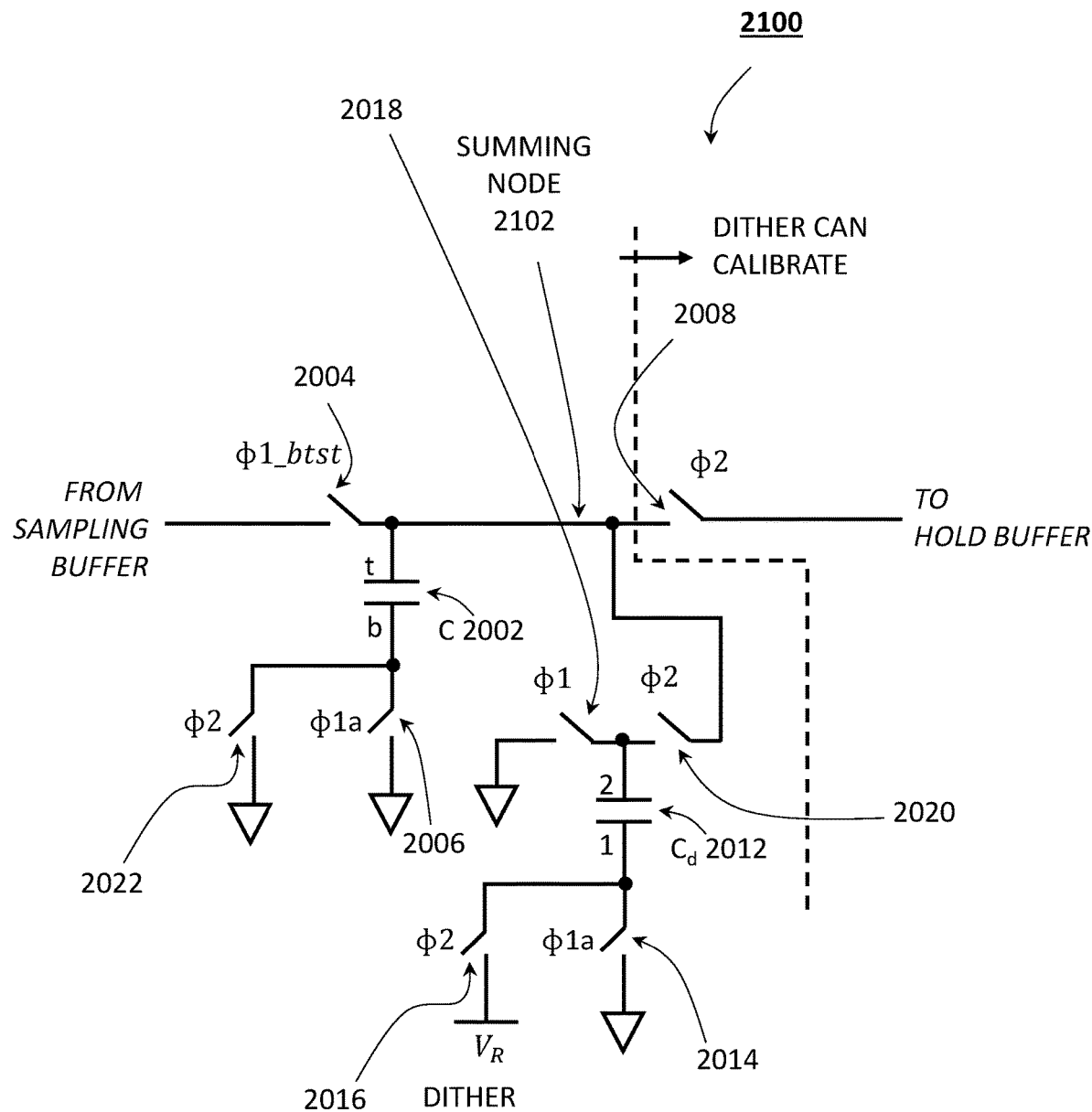

FIG. 21 shows yet another exemplary sampling network 2100 with split-capacitor dither injection, according to some embodiments of the disclosure. Similar to FIG. 20, additive dither is injected in the sampling network 2100. Different from FIG. 20 is that in FIG. 21 a dither injection switched-capacitor network is added to a summing node 2102 (which is also the top plate of capacitor C 2002) that is upstream from output switch 2008. The dither transfer switch 2020 having phase φ2 connects the second plate of the dither capacitor $C_d$ 2012 to the summing node 2102 during hold-phase to add the dither to the summing node 2102. The output switch 2008 having phase φ2 connects the top plate of the capacitor C 2002 (which is also the summing node 2101) to the input of a hold buffer.

By adding the dither upstream of the output switch 2008, the dither can be used to calibrate output switch 2008, and the need to have the output switch 2008 to be bootstrapped can be avoided. Output switch 2008 in FIG. 21 does not have to be bootstrapped, since the dither being injected can be used to calibrate output switch 2008. If indeed the output switch 2008 is bootstrapped, then calibration may not be needed since the output switch 2008 is linear enough. If the output switch 2008 is not bootstrapped (e.g., just boosted), as seen in FIG. 21, then calibration can be implemented to address non-linearities of the output switch 2008.

In some embodiments, bottom plate sampling is optional. When bottom plate sampling is implemented, the sampling of the input signal onto a capacitor and even clearing/ resetting of the dither capacitor can benefit from reduced distortions.

In some embodiments, the output switch 1902 and the output switch 2008 seen in the FIGS. 17-21 can be integrated with a chopper to inject a multiplicative dither (e.g., as illustrated in FIGS. 2 and 3).

In Some embodiments, Buffer-2 seen in the FIGURES can be a unity gain buffer. In some embodiments, Buffer-2 seen in the FIGURES can be an amplifier (having a gain that is greater than 1). Providing amplification can be beneficial in cases where the held signal is to be amplified to match an input range of circuits downstream of the T/H circuit. In some embodiments, Buffer-2 seen in the FIGURES can be a variable gain amplifier. Providing variable amplification can be beneficial in cases where (automatic) gain control is implemented to control the gain/attenuation of the T/H circuit, and affect the amplitude of the signal at the output of the T/H circuit. Some errors in the T/H circuits can be more severe when Buffer-2 is an amplifier or variable gain amplifier (than when Buffer-2 is a unity gain buffer), and the calibrations described herein can address those errors effectively.

Herein, the implementation of the T/H circuits is illustrated in single-ended form. In practice, the T/H circuits can be implemented differentially to suppress possible even-order harmonics.

Sampling capacitors are labeled with "t" and "b" to denote top plate and bottom plate respectively.

Herein, switches represents electronic circuitry which can be controlled to conduct current or not conduct current. In practice, switches can be implemented using transistors. By biasing the transistors appropriately, the transistor can conduct current or not conduct current (be "on" or "off" respectively). When the switch is closed or "on", current conducts to complete the circuit path. When a switch is opened or "off", current does not conduct and the circuit path is open. Switches can effectively connect one part of a circuit to another part of a circuit, or disconnect one part of a circuit to another part of a circuit.

Note that the activities discussed above with reference to the FIGURES are applicable to any integrated circuits that involve processing analog signals and converting the analog signals into digital data using one or more ADCs. In certain contexts, the features discussed herein related to ADCs in general, including, e.g., ADCs of various flavors including pipeline ADCs, delta sigma ADCs, successive approximation register ADCs, multi-stage ADCs, time-interleaved ADCs, randomized time-interleaved ADCs, etc. The features can be particularly beneficial to high speed ADCs, where input frequencies are relatively high in the giga-hertz range. The ADC can be applicable to medical systems, scientific instrumentation, wireless and wired communications systems (especially systems requiring a high sampling rate), radar, industrial process control, audio and video equipment, instrumentation, and other systems which uses ADCs. The level of performance offered by high speed ADCs can be particularly beneficial to products and systems in demanding markets such as high speed communications, medical imaging, synthetic aperture radar, digital beam-forming communication systems, broadband communication systems, high performance imaging, and advanced test/measurement systems (oscilloscopes).

The present disclosure encompasses apparatuses which can perform the various methods described herein. Such apparatuses can include circuitry illustrated by the FIGURES and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on a non-transitory computer medium.

In the discussions of the embodiments herein, the parts and components can readily be replaced, substituted, or otherwise modified in order to accommodate particular circuitry needs. Moreover, it should be noted that the use of complementary electronic devices, hardware, etc. offer an equally viable option for implementing the teachings of the present disclosure. For instance, complementary configurations using PMOS transistor(s) (p-type metal-oxide semiconductor transistor(s)) to replace NMOS transistor(s) (n-type metal-oxide semiconductor transistor(s)) or vice versa, are envisioned by the disclosure. For instance, the present disclosure/claims encompasses implementations where all NMOS devices are replaced by PMOS devices, or vice versa. Connections and the circuit can be reconfigured to achieve the same function. These implementations are equivalent to the disclosed implementations using complementary transistors devices because the implementations would perform substantially the same function in substantially the same way to yield substantially the same result. It is understood by one skilled in the art that a transistor device can be generalized as a device having three (main) terminals. Furthermore, it is understood by one skilled in the art that a switch, a transistor, or transistor device, during operation, can have a characteristic behavior of transistors corresponding to devices such as NMOS, PMOS devices (and any other equivalent transistor devices).

In one example embodiment, any number of components of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on-chip (SOC) package, either in part, or in whole. An SOC represents an integrated circuit that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples described herein. Note that all optional features of the apparatus described above may also be implemented with respect to the method or process described herein and specifics in the examples may be used anywhere in one or more embodiments.

What is claimed is:

1. A method for addressing errors in time-interleaved sampling networks, comprising:
    injecting an additive dither in each time-interleaved sampling network, each time-interleaved sampling network sampling an input signal in a randomized sequence;
    quantizing outputs of the time-interleaved sampling networks to generate a digital output;
    updating different correction coefficients for a first time-interleaved sampling network based on the additive dither, using samples of the digital output generated according to different orders in which the time-interleaved sampling networks sample the input signal; and
    correcting the digital output corresponding to the different orders separately, using the different correction coefficients.

2. The method of claim 1, wherein updating different correction coefficients comprises:
    updating a first correction coefficient for the first time-interleaved sampling network based on the additive dither and samples of the digital output that correspond to a first order of time-interleaved sampling networks sampling the input signal; and
    updating a second correction coefficient for the first time-interleaved sampling network based on the additive dither and samples of the digital output that correspond to a second order of time-interleaved sampling networks sampling the input signal.

3. The method of claim 2, wherein correcting the digital output comprises:
    correcting samples of the digital output that correspond to the first order based on the first correction coefficient; and
    correcting samples of the digital output that correspond to the second order based on the second correction coefficient.

4. The method of claim 1, wherein the different orders specify which one of the time-interleaved sampling networks generated one or more of the following: a given sample, a previous sample, and a subsequent sample.

5. The method of claim 1, further comprising:
    injecting a multiplicative dither in each time-interleaved sampling network.

6. The method of claim 5, wherein updating the different correction coefficients comprises:
    updating the different correction coefficients using samples of the digital output generated according to: (1) the different orders, and (2) different values of the multiplicative dither corresponding to one or more of the following: a given sample, a previous sample, and a subsequent sample.

7. The method of claim 5, wherein correcting the digital output comprises:
    correcting the digital output for offset errors before removing the multiplicative dither from the digital output.

8. The method of claim 1, wherein:
    updating the different correction coefficients comprises adaptively adjusting the different correction coefficients, based on corrected samples of the digital output and the additive dither, to reduce the errors.

9. The method of claim 1, wherein:
    one of the errors is defined based on the additive dither and a sample of the digital output with an estimate of the additive dither removed; and
    the estimate of the additive dither is based on the additive dither and a corresponding correction coefficient.

10. The method of claim 1, wherein:
    one of the errors is defined based on the additive dither corresponding to a previous sample of the digital output and a sample of the digital output with an estimate of a memory contribution removed; and
    the estimate of the memory contribution is based on the previous sample of the digital output and a corresponding correction coefficient.

11. The method of claim 1, wherein:
    one of the errors is defined based on the additive dither corresponding to a previous sample of the digital output generated by the first time-interleaved sampling network and a sample of the digital output with an estimate of a memory contribution removed; and
    the estimate of the memory contribution is based on the previous sample of the digital output generated by the first time-interleaved sampling network and a corresponding correction coefficient.

12. The method of claim 1, wherein:
    one of the errors is defined based on a sample of the digital output and an estimate of offset.

13. The method of claim 1, wherein correcting the digital output comprises:
    correcting the digital output for memory errors before correcting for offset and/or gain errors.

14. The method of claim 1, wherein the different correction coefficients comprise correction coefficients to reduce memory error due to partial resetting of the time-interleaved sampling networks.

15. The method of claim 1, further comprising:
    resetting a summing node of the time-interleaved sampling networks by overlapping a sampling clock signal and a hold clock signal.

16. The method of claim 1, further comprising:
    resetting the first time-interleaved sampling network when the first time-interleaved sampling network remains idle for more than one phase.

17. The method of claim 1, wherein the errors comprise one or more of: non-idealities in a hold-phase of the first time-interleaved sampling network, hold-phase gain error, hold-phase memory error, hold-phase offset error, and hold-phase non-linearities.

18. The method of claim 1, wherein the errors comprise one or more of: non-idealities in a track-phase of the first time-interleaved sampling network, track-phase gain error, track-phase memory error, and track-phase offset error.

19. A method for addressing errors in time-interleaved sampling networks, comprising:
injecting an additive dither and a multiplicative dither in each time-interleaved sampling network, each time-interleaved sampling network sampling an input signal in a sequence;
quantizing outputs of the time-interleaved sampling networks to generate a digital output;
updating different correction coefficients for a first time-interleaved sampling network based on the additive dither, using samples of the digital output generated according to different values of the multiplicative dither; and
correcting the digital output corresponding to the different values of the multiplicative dither separately, using the different correction coefficients.

20. The method of claim 19, wherein updating the different correction coefficients comprises:
updating a first correction coefficient for the first time-interleaved sampling network based on the additive dither and samples of the digital output that correspond to a first value of the multiplicative dither; and
updating a second correction coefficient for the first time-interleaved sampling network based on the additive dither and samples of the digital output that correspond to a second value of the multiplicative dither.

21. The method of claim 19, wherein correcting the digital output comprises:
correcting samples of the digital output that correspond to the value of the multiplicative dither; and
correcting samples of the digital output that correspond to the value of the multiplicative dither.

22. The method of claim 19, wherein the different values of the multiplicative dither comprises +1 and −1.

23. The method of claim 19, wherein injecting a multiplicative dither comprises changing a polarity of a differential signal in the first time-interleaved sampling network when a value of the multiplicative dither is −1.

24. The method of claim 19, wherein updating the different correction coefficients comprises:
updating the different correction coefficients using samples of the digital output generated according to: (1) different orders in which the time-interleaved sampling networks sample the input signal, and (2) the different values of the multiplicative dither corresponding to one or more of the following: a given sample, a previous sample, and a subsequent sample.

25. The method of claim 19, wherein:
updating the different correction coefficients comprises adaptively adjusting the different correction coefficients, based on corrected samples of the digital output and the additive dither, to reduce the errors.

26. The method of claim 19, wherein:
one of the errors is defined based on the additive dither and a sample of the digital output with an estimate of the additive dither removed; and
the estimate of the additive dither is based on the additive dither and a corresponding correction coefficient.

27. The method of claim 19, wherein:
one of the errors is defined based on the additive dither corresponding to a previous sample of the digital output and a sample of the digital output with an estimate of a memory contribution removed; and
the estimate of the memory contribution is based on the previous sample of the digital output and a corresponding correction coefficient.

28. The method of claim 19, wherein:
one of the errors is defined based on the additive dither corresponding to a previous sample of the digital output generated by the first time-interleaved sampling network and a sample of the digital output with an estimate of a memory contribution removed; and
the estimate of the memory contribution is based on the previous sample of the digital output generated by the first time-interleaved sampling network and a corresponding correction coefficient.

29. The method of claim 19, wherein:
one of the errors is defined based on a sample of the digital output and an estimate of offset.

30. The method of claim 19, wherein correcting the digital output comprises:
correcting the digital output for memory errors before correcting for offset and/or gain errors.

31. The method of claim 19, wherein correcting the digital output comprises:
correcting the digital output for offset errors before removing the multiplicative dither from the digital output.

32. The method of claim 19, wherein the different correction coefficients comprise correction coefficients to reduce memory error due to partial resetting of the time-interleaved sampling networks.

33. The method of claim 19, further comprising:
resetting a summing node of the time-interleaved sampling networks by overlapping a sampling clock signal and a hold clock signal.

34. The method of claim 19, further comprising:
resetting the first time-interleaved sampling network when the first time-interleaved sampling network remains idle for more than one phase.

35. The method of claim 19, wherein the errors comprise one or more of:
non-idealities in a hold-phase of the first time-interleaved sampling network, hold-phase gain error, hold-phase memory error, hold-phase offset error, and hold-phase non-linearities.

36. The method of claim 19, wherein the errors comprise one or more of:
non-idealities in a track-phase of the first time-interleaved sampling network, track-phase gain error, track-phase memory error, and track-phase offset error.

37. A system with calibration, comprising:
track-and-hold circuit to receive an analog input, wherein the track-and-hold circuit comprises randomized time-interleaved sampling networks, and each time-interleaved sampling network has additive dither injection circuitry;
analog-to-digital converter to digitize an output from the track-and-hold circuit; and
digital calibration logic to:
determine different correction coefficients separately using samples of a digital output from the analog-to-digital converter generated according to different orders in which the randomized time-interleaved sampling networks sample the analog input, and correct a digital output from the analog-to-digital converter using the different correction coefficients.

38. The system of claim 37, wherein:

each time-interleaved sampling network has a random chopper; and the digital calibration logic is further to determine the different correction coefficients separately for the different orders and for different states of the random chopper.

39. The system of claim 38, further comprising:

memory, for each randomized time-interleaved sampling network, to store a last sample of the digital output generated using the given randomized time-interleaved sampling network.

\* \* \* \* \*